US012796357B2

(12) United States Patent
Huang

(10) Patent No.: US 12,796,357 B2
(45) Date of Patent: Nov. 10, 2026

(54) SEMICONDUCTOR DEVICE WITH POROUS LAYER AND METHOD FOR FABRICATING THE SAME

(71) Applicant: NANYA TECHNOLOGY CORPORATION, New Taipei City (TW)

(72) Inventor: Tse-Yao Huang, Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 413 days.

(21) Appl. No.: 18/240,475

(22) Filed: Aug. 31, 2023

(65) Prior Publication Data

US 2024/0387166 A1 Nov. 21, 2024

Related U.S. Application Data

(62) Division of application No. 18/199,455, filed on May 19, 2023, now Pat. No. 12,482,649.

(51) Int. Cl.
*H10P 14/60* (2026.01)
*H10P 76/40* (2026.01)
(Continued)

(52) U.S. Cl.
CPC .......... *H10P 14/665* (2026.01); *H10P 76/408* (2026.01); *H10W 20/035* (2026.01); *H10W 20/045* (2026.01); *H10W 20/071* (2026.01); *H10W 20/425* (2026.01); *H10W 20/435* (2026.01); *H10W 20/47* (2026.01)

(58) Field of Classification Search
CPC ......... H01L 21/02203; H01L 23/53295; H01L 23/5329; H01L 23/528; H01L 23/522
See application file for complete search history.

(56) References Cited

U.S. PATENT DOCUMENTS

2007/0222078 A1* 9/2007 Furuya ................ H10W 20/033 257/E23.142
2007/0249156 A1* 10/2007 Bonilla ............ H01L 21/02074 257/E21.241
(Continued)

OTHER PUBLICATIONS

Office Action and and the search report mailed on Nov. 30, 2023 related to Taiwanese Application No. 112125065.
(Continued)

*Primary Examiner* — Brian Turner
(74) *Attorney, Agent, or Firm* — Xuan Zhang

(57) ABSTRACT

The present application discloses a semiconductor device and a method for fabricating the semiconductor device. The semiconductor device includes a substrate; a bottom interconnector layer positioned in the substrate; a bottom dielectric layer positioned on the bottom glue layer; an interconnector structure positioned along the bottom dielectric layer and the bottom glue layer, positioned on the bottom interconnector layer, and positioned on the bottom dielectric layer; a top glue layer conformally positioned on the bottom dielectric layer and the interconnector structure; a top dielectric layer positioned surrounding the top glue layer. A top surface of the top glue layer and a top surface of the top dielectric layer are substantially coplanar. The top dielectric layer is porous.

5 Claims, 18 Drawing Sheets

(51) Int. Cl.

| | |
|---|---|
| ***H10W 20/00*** | (2026.01) |
| ***H10W 20/41*** | (2026.01) |
| ***H10W 20/47*** | (2026.01) |

(56) References Cited

U.S. PATENT DOCUMENTS

| | | | | |
|---|---|---|---|---|
| 2008/0171431 | A1* | 7/2008 | Yu | H10W 20/072 438/618 |
| 2012/0100717 | A1* | 4/2012 | Lii | H10P 50/73 257/E21.586 |
| 2017/0309513 | A1* | 10/2017 | Zhou | H10W 20/425 |
| 2018/0166333 | A1* | 6/2018 | Yang | H10W 20/01 |
| 2021/0280560 | A1 | 9/2021 | Huang | |
| 2021/0343535 | A1* | 11/2021 | Lin | H10P 14/43 |
| 2022/0310449 | A1* | 9/2022 | Kuang | H01L 25/0657 |
| 2024/0038666 | A1* | 2/2024 | Cheng | H01L 23/5329 |

OTHER PUBLICATIONS

Office Action and and the search report mailed on Apr. 24, 2025 related to Taiwanese Application No. 113108412.

Summary translation of Office Action and and the search report mailed on Apr. 24, 2025 related to Taiwanese Application No. 113108412.

Office Action and and the search report mailed on Sep. 9, 2025 related to U.S. Appl. No. 18/199,455, wherein this application is a div of U.S. Appl. No. 18/199,455.

* cited by examiner

SEMICONDUCTOR DEVICE WITH POROUS LAYER AND METHOD FOR FABRICATING THE SAME

CROSS-REFERENCE TO RELATED APPLICATION

This application is a divisional application of U.S. Non-Provisional application Ser. No. 18/199,455 filed May 19, 2023, which is incorporated herein by reference in its entirety.

TECHNICAL FIELD

The present disclosure relates to a semiconductor device and a method for fabricating the semiconductor device, and more particularly, to a semiconductor device with a porous layer and a method for fabricating the semiconductor device with the porous layer.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; a bottom interconnector layer positioned in the substrate; a bottom dielectric layer positioned on the substrate; an interconnector structure positioned along the bottom dielectric layer, positioned on the bottom interconnector layer, and positioned on the bottom dielectric layer; a top glue layer conformally positioned on the bottom dielectric layer and the interconnector structure; a top dielectric layer positioned surrounding the top glue layer. A top surface of the top glue layer and a top surface of the top dielectric layer are substantially coplanar. The top dielectric layer is porous.

Another aspect of the present disclosure provides a semiconductor device including a substrate; a bottom interconnector layer positioned in the substrate; a bottom dielectric layer positioned on the substrate; an interconnector structure positioned along the bottom dielectric layer, positioned on the bottom interconnector layer, and positioned on the bottom dielectric layer; a top glue layer conformally positioned on the bottom dielectric layer and surrounding the interconnector structure; a top dielectric layer positioned surrounding the top glue layer. A top surface of the top glue layer and a top surface of the interconnector structure are substantially coplanar. The top dielectric layer is porous.

Another aspect of the present disclosure provides a method for fabricating a semiconductor device including providing a substrate; forming a bottom interconnector layer in the substrate; forming a bottom energy-removable layer on the substrate; forming an interconnector structure along the bottom energy-removable layer and on the bottom energy-removable layer and the bottom interconnector layer; conformally forming a top glue layer on the bottom dielectric layer and the interconnector structure; forming a top energy-removable layer surrounding the top glue layer; performing an energy treatment to turn the bottom energy-removable layer into a bottom dielectric layer and turn the top energy-removable layer into a top dielectric layer. A top surface of the top glue layer and a top surface of the top dielectric layer are substantially coplanar. The top dielectric layer and the bottom dielectric layer are porous.

Due to the design of the semiconductor device of the present disclosure, the parasitic capacitance of the semiconductor device may be reduced by employing the bottom dielectric layer having low dielectric constant. As a result, the performance of the semiconductor device may be improved. In addition, the top glue layer may improve the adhesion of the bottom dielectric layer and the top dielectric layer.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
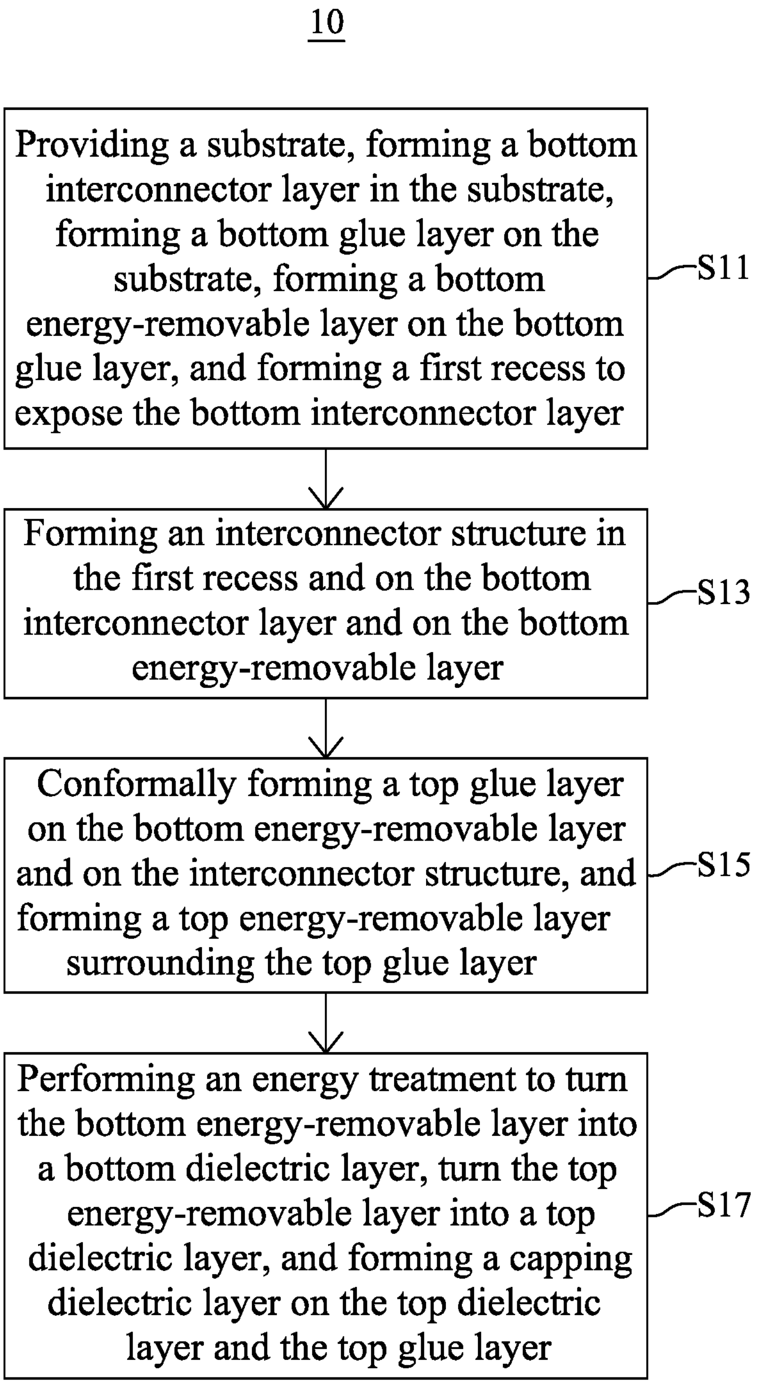
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that, in the description of the present disclosure, the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, the functions or steps noted herein may occur in an order different from the order noted in the figures. For example, two figures shown in succession may in fact be executed substantially concurrently or may sometimes be executed in a reversed order, depending upon the functionalities or steps involved.

FIG. 1 illustrates, in a flowchart diagram form, a method 10 for fabricating a semiconductor device 1A in accordance with one embodiment of the present disclosure. FIGS. 2 to 15 illustrate, in schematic cross-sectional view diagrams, a flow for fabricating the semiconductor device 1A in accordance with one embodiment of the present disclosure.

With reference to FIGS. 1 to 5, at step S11, a substrate 101 may be provided, a bottom interconnector layer 103 may be formed in the substrate 101, a bottom glue layer 201 may be formed on the substrate 101, a bottom energy-removable layer 501 may be formed on the bottom glue layer 201, and a first recess R1 may be formed to expose the bottom interconnector layer 103.

Figure 2:
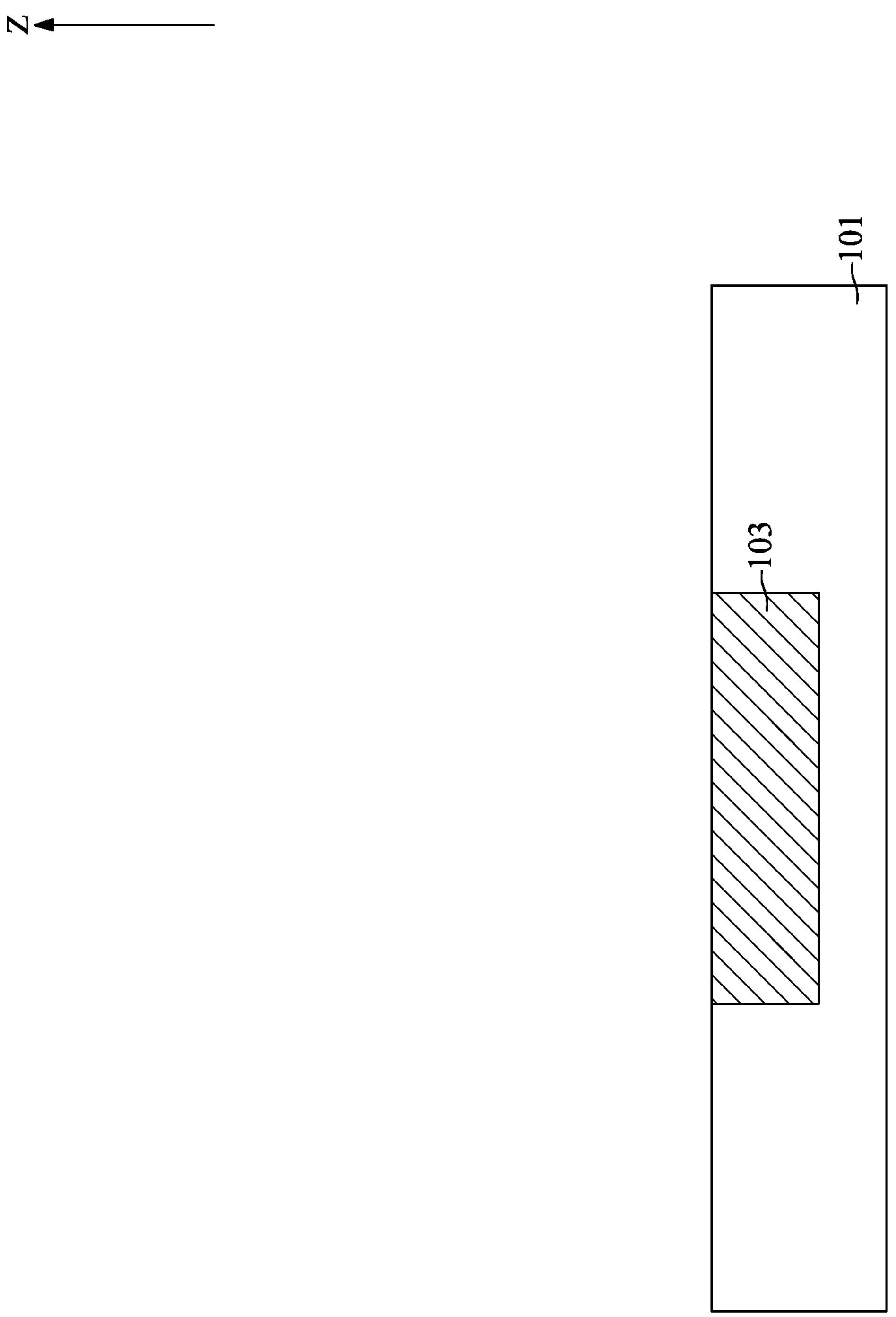
FIGS. 2 to 15 illustrate, in schematic cross-sectional view diagrams, a flow for fabricating the semiconductor device in accordance with one embodiment of the present disclosure.

With reference to FIG. 2, the substrate 101 may include a bulk semiconductor substrate that is composed entirely of at least one semiconductor material, a plurality of device elements (not shown for clarity), a plurality of dielectric layers (not shown for clarity), and a plurality of conductive features (not shown for clarity). The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the substrate 101 may further include a semiconductor-on-insulator structure which consists of, from bottom to top, a handle substrate, an insulator layer, and a topmost semiconductor material layer. The handle substrate and the topmost semiconductor material layer may be formed of the same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and 200 nm.

It should be noted that, in the description of present disclosure, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The plurality of device elements may be formed on the substrate 101. Some portions of the plurality of device elements may be formed in the substrate 101. The plurality of device elements may be transistors such as complementary metal-oxide-semiconductor transistors, metal-oxide-semiconductor field-effect transistors, fin field-effect-transistors, the like, or a combination thereof.

The plurality of dielectric layers may be formed on the substrate 101 and cover the plurality of device elements. In some embodiments, the plurality of dielectric layers may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The plurality of dielectric layers may be formed by deposition processes such as chemical vapor deposition, plasma-enhanced chemical vapor deposition, or the like. Planarization processes may be performed after the deposition processes to remove excess material and provide a substantially flat surface for subsequent processing steps.

The plurality of conductive features may include interconnect layers, conductive vias, and conductive pads. The interconnect layers may be separated from each other and may be horizontally disposed in the plurality of dielectric layers along the direction Z. In the present embodiment, the topmost interconnect layers may be designated as the conductive pads. The conductive vias may connect adjacent interconnect layers along the direction Z, adjacent device element and interconnect layer, and adjacent conductive pad and interconnect layer. In some embodiments, the conductive vias may improve heat dissipation and may provide structure support. In some embodiments, the plurality of conductive features may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The plurality of conductive features may be formed during the formation of the plurality of dielectric layers.

In some embodiments, the plurality of device elements and the plurality of conductive layers may together configure functional units of the semiconductor device 1A. A functional unit, in the description of the present disclosure, generally refers to functionally related circuitry that has been partitioned for functional purposes into a distinct unit. In some embodiments, the functional units of the semiconductor device 1A may include, for example, highly complex circuits such as processor cores, memory controllers, accelerator units, or other applicable functional circuitry.

With reference to FIG. 2, the bottom interconnector layer 103 may be referred to as part of the conductive features of the substrate 101. In some embodiments, the bottom interconnector layer 103 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. In some embodiments, the top surface of the substrate 101 and the top surface of the bottom interconnector layer 103 may be substantially coplanar.

Figure 3:
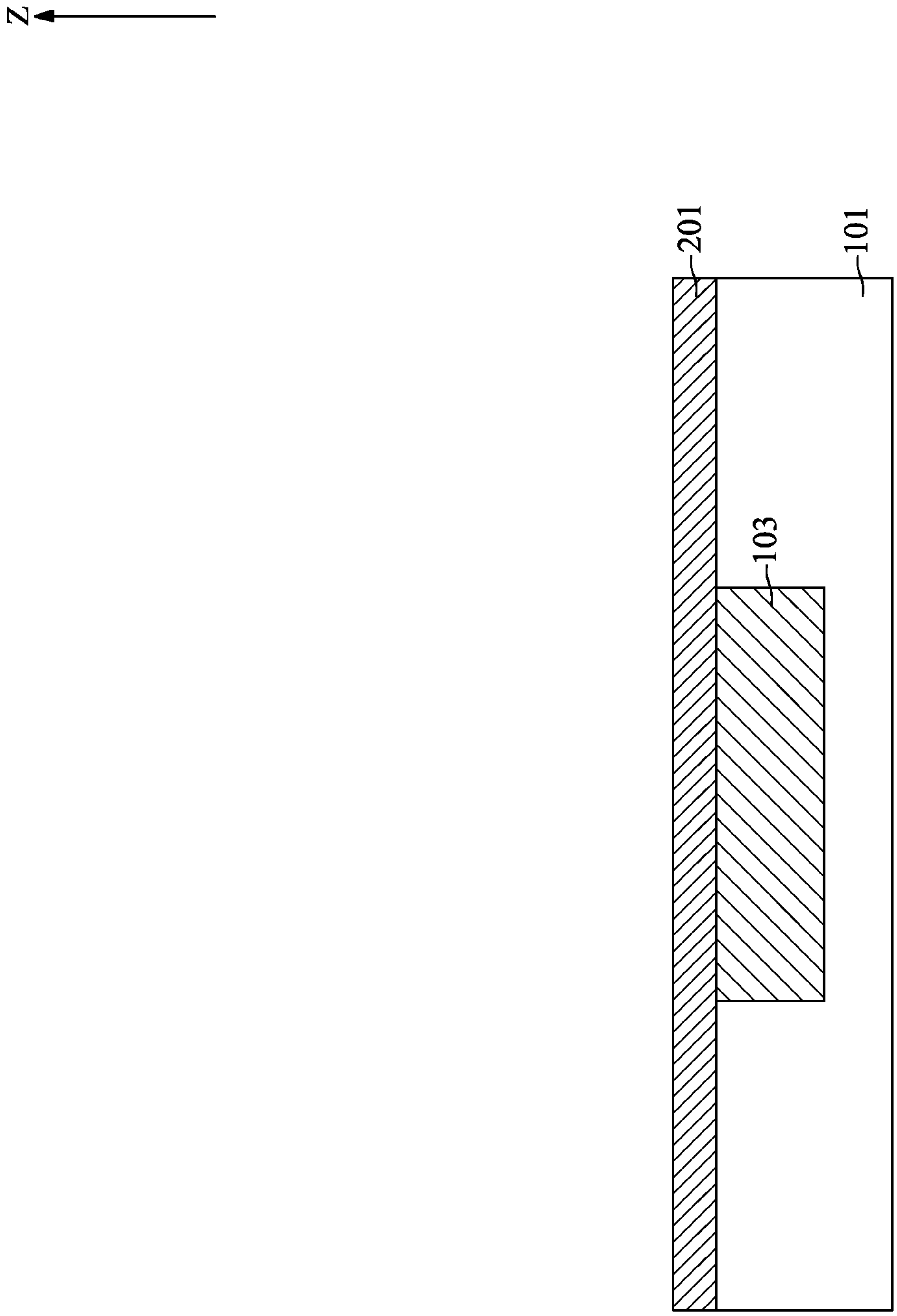

With reference to FIG. 3, the bottom glue layer 201 may be formed on the substrate 101. In some embodiments, the bottom glue layer 201 may be formed of a low porous dielectric material. For example, the porosity of the bottom glue layer 201 may be less than 5%, less than 4%, less than 3%, less than 2%, less than 1%, or may be 0%. In some embodiments, the bottom glue layer 201 may be formed of, for example, silicon oxide. In some embodiments, the bottom glue layer 201 may be formed of a material having etching selectivity to the bottom energy-removable layer 501 which will be illustrated later. In some embodiments, the bottom glue layer 201 may be formed of a material having etching selectivity to aluminum, copper, or tungsten. In some embodiments, the bottom glue layer 201 may be formed of, for example, silicon nitride, silicon oxynitride, silicon nitride oxide, or a combination thereof. In some embodiments, the bottom glue layer 201 may be formed by, for example, atomic layer deposition, chemical vapor deposition, plasma-enhanced chemical vapor deposition, or other applicable deposition processes. In some embodiments, the bottom glue layer 201 may improve the adhesion between the substrate 101 and a bottom energy-removable layer 501 which will be illustrated later.

It should be noted that, in the description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

Figure 4:
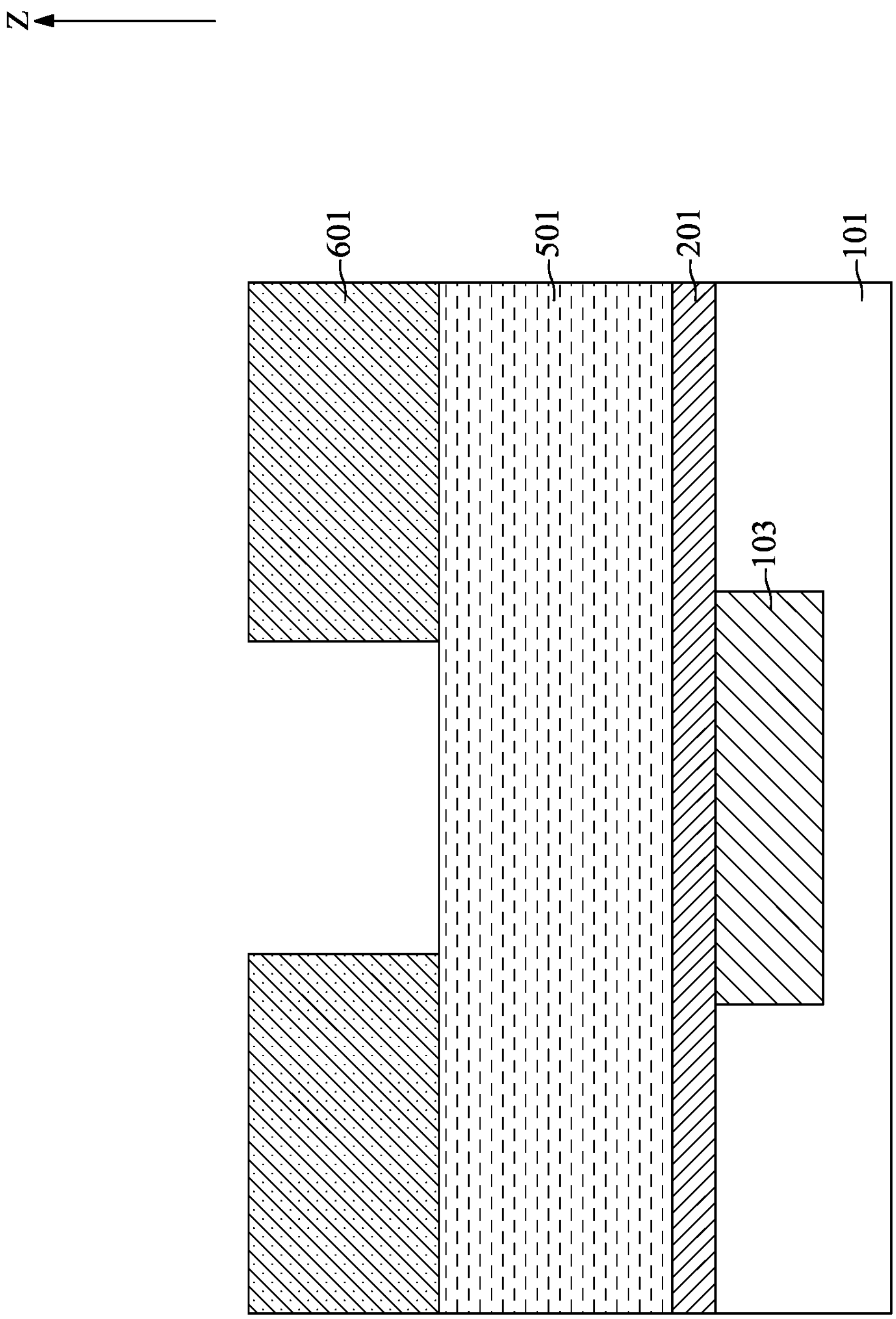

With reference to FIG. 4, a bottom energy-removable layer 501 may be formed on the bottom glue layer 201. In some embodiments, the bottom energy-removable layer 501 may include a material such as a thermal decomposable material, a photonic decomposable material, an e-beam decomposable material, or a combination thereof. For example, the bottom energy-removable layer 501 may include a base material and a decomposable porogen material that is sacrificially removed upon exposure to an energy source. The base material may include a methylsilsesquioxane based material. The decomposable porogen material may include a porogen organic compound that provides porosity to the base material of the bottom energy-removable layer 501.

In some embodiments, the bottom energy-removable layer 501 may include about 50% of the decomposable porogen material, and about 50% of the base material. In some embodiments, the bottom energy-removable layer 501 may include about 45% of the decomposable porogen material, and about 55% of the base material. In some embodiments, the bottom energy-removable layer 501 may include about 35% of the decomposable porogen material, and about 65% of the base material. In some embodiments, the bottom energy-removable layer 501 may include about 25% of the decomposable porogen material, and about 75% of the base material. In some embodiments, the bottom energy-removable layer 501 may include about 15% of the decomposable porogen material, and about 85% of the base material. In some embodiments, the bottom energy-removable layer 501 may include about 10% of the decomposable porogen material, and about 90% of the base material.

With reference to FIG. 4, a first mask layer 601 may be formed on the bottom energy-removable layer 501. In some embodiments, the first mask layer 601 may be a photoresist layer and may include a pattern of a first recess R1 which will be illustrated later. The pattern of the first mask layer 601 may be formed by performing a photolithography process. The un-patterned first mask layer 601 (not shown in FIG. 4) may be exposed to process light according to a mask (not shown in FIG. 4). A wavelength of the process light may be associated with the critical dimension of the pattern. In some embodiments, the process light may be a deep ultraviolet (DUV). In some embodiments, the process light may be an extreme ultraviolet (EUV), and the photolithography process may be an EUV lithography. After exposing the process light, a pattern on the mask is converted to the un-patterned first mask layer 601. The un-patterned first mask layer 601 may be then etched according to the converted pattern so as to form the pattern on the first mask layer 601.

Figure 5:
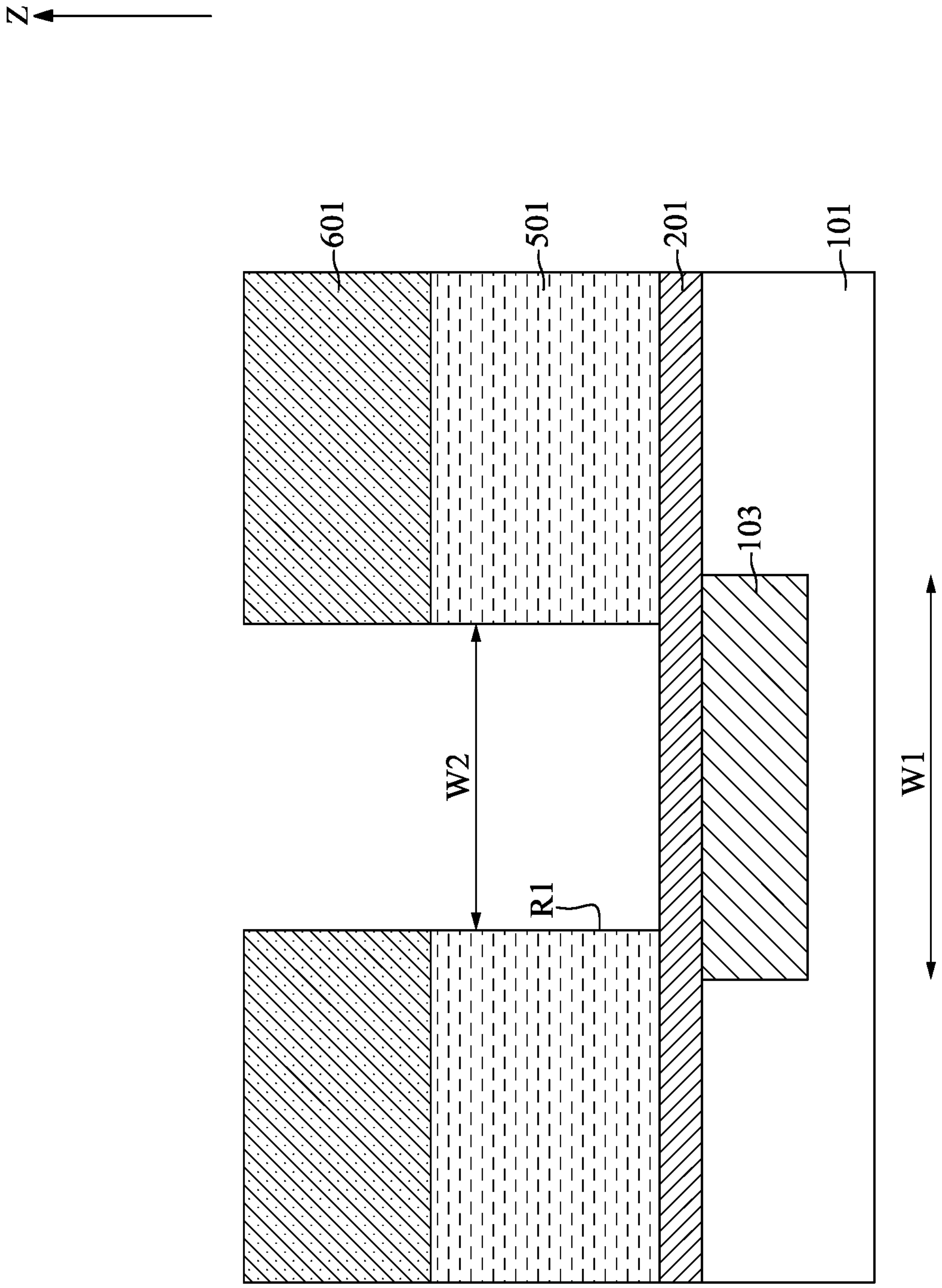

With reference to FIG. 5, a first recess etching process may be performed to remove portions of the bottom energy-removable layer 501 and the bottom glue layer 201. In some embodiments, the first recess etching process may be a multi-stage etching process. For example, the first recess etching process may be a two-stage anisotropic dry etching process. The etching chemistry may be different for each stage to provide different etching selectivity. In some embodiments, the etch rate ratio of the bottom energy-removable layer 501 to the bottom glue layer 201 may be between about 100:1 and about 1.05:1, between about 15:1 and about 2:1, or between about 10:1 and about 2:1 during first stage of the first recess etching process. In some embodiments, the etch rate ratio of the bottom glue layer 201 to the bottom interconnector layer 103 may be between about 100:1 and about 1.05:1, between about 15:1 and about 2:1, or between about 10:1 and about 2:1 during second stage of the first recess etching process.

With reference to FIG. 5, after the first recess etching process, the first recess R1 may be formed along the bottom energy-removable layer 501 and the bottom glue layer 201. The bottom interconnector layer 103 may be partially exposed through the first recess R1. In some embodiments, the width W2 of the first recess R1 may be less than the width W1 of the bottom interconnector layer 103. After the formation of the first recess R1, the first mask layer 601 may be removed.

With reference to FIG. 1 and FIGS. 6 to 10, at step S13, an interconnector structure 400 may be formed in the first recess R1 and on the bottom interconnector layer 103 and on the bottom energy-removable layer 501.

Figure 6:
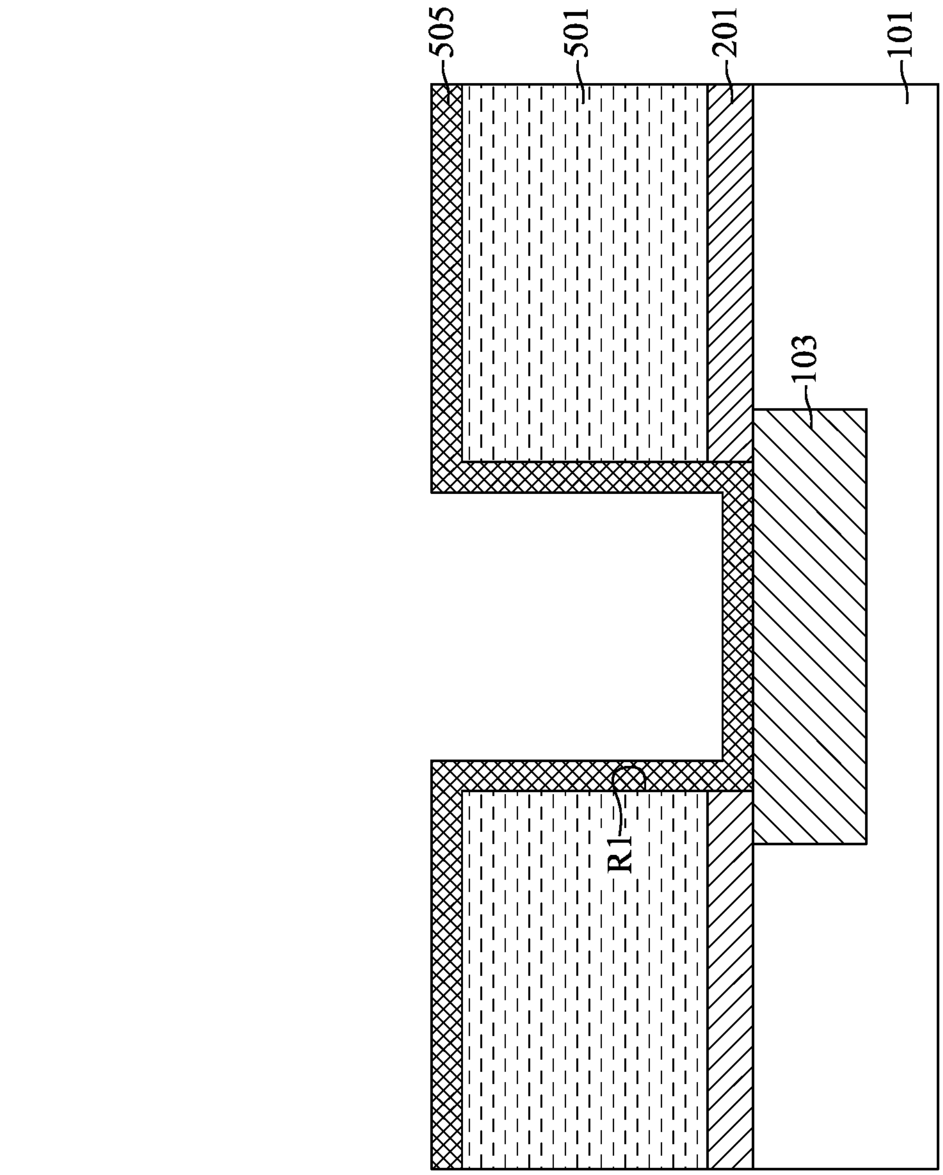

With reference to FIG. 6, a layer of barrier material 505 may be conformally formed in the first recess R1, on the bottom interconnector layer 103, and on the bottom energy-removable layer 501. In some embodiments, the barrier material 505 may include, for example, titanium, titanium nitride, tantalum, tantalum nitride, or a combination thereof. In some embodiments, the barrier material 505 may be formed by, for example, chemical vapor deposition, atomic layer deposition, plasma-enhanced chemical vapor deposition, or other applicable deposition processes.

For example, the layer of barrier material 505 may be formed by chemical vapor deposition. In some embodiments, the formation of the layer of barrier material 505 may include a source gas introducing step, a first purging step, a reactant flowing step, and a second purging step. The source gas introducing step, the first purging step, the reactant flowing step, and the second purging step may be referred to as one cycle. Multiple cycles may be performed to obtain the desired thickness of the layer of barrier material 505.

Detailedly, the intermediate semiconductor device illustrated in FIG. 5 may be loaded in a reaction chamber. In the source gas introducing step, source gases containing a precursor and a reactant may be introduced to the reaction chamber containing the intermediate semiconductor device. The precursor and the reactant may diffuse across the boundary layer and reach the surface of the intermediate semiconductor device (i.e., the surface of the bottom energy-removable layer 501, the first recess R1, and the bottom interconnector layer 103). The precursor and the reactant may adsorb on and subsequently migrate on the surface aforementioned. The adsorbed precursor and the adsorbed reactant may react on the surface aforementioned and form solid byproducts. The solid byproducts may form nuclei on the surface aforementioned. The nuclei may grow into islands and the islands may merge into a continuous thin film on the surface aforementioned. In the first purging step, a purge gas such as argon may be injected into the reaction chamber to purge out the gaseous byproducts, unreacted precursor, and unreacted reactant.

In the reactant flowing step, the reactant may be solely introduced to the reaction chamber to turn the continuous thin film into the layer of barrier material 505. In the second purging step, a purge gas such as argon may be injected into the reaction chamber to purge out the gaseous byproducts and unreacted reactant.

In some embodiments, the formation of the layer of barrier material 505 using chemical vapor deposition may be performed with the assistance of plasma. The source of the plasma may be, for example, argon, hydrogen, or a combination thereof.

In some embodiments, the precursor may be titanium tetrachloride. The reactant may be ammonia. Titanium tetrachloride and ammonia may react on the surface and form a titanium nitride film including high chloride contamination due to incomplete reaction between titanium tetrachloride and ammonia. The ammonia in the reactant flowing step may reduce the chloride content of the titanium nitride film. After the ammonia treatment, the titanium nitride film may be referred to as the layer of barrier material 505.

For another example, the layer of barrier material 505 may be formed by atomic layer deposition such as photo-assisted atomic layer deposition or liquid injection atomic layer deposition. In some embodiments, the formation of the layer of barrier material 505 may include a first precursor introducing step, a first purging step, a second precursor introducing step, and a second purging step. The first precursor introducing step, the first purging step, the second precursor introducing step, and the second purging step may be referred to as one cycle. Multiple cycles may be performed to obtain the desired thickness of the layer of barrier material 505.

Detailedly, the intermediate semiconductor device illustrated in FIG. 5 may be loaded in the reaction chamber. In the first precursor introducing step, a first precursor may be introduced to the reaction chamber. The first precursor may diffuse across the boundary layer and reach the surface of the intermediate semiconductor device (i.e., the surface of the bottom energy-removable layer 501, the first recess R1, and the bottom interconnector layer 103). The first precursor may adsorb on the surface aforementioned to form a monolayer at a single atomic layer level. In the first purging step, a purge gas such as argon may be injected into the reaction chamber to purge out unreacted first precursor.

In the second precursor introducing step, a second precursor may be introduced to the reaction chamber. The second precursor may react with the monolayer and turn the monolayer into the layer of barrier material 505. In the second purging step, a purge gas such as argon may be injected into the reaction chamber to purge out unreacted second precursor and gaseous byproduct. Compared to chemical vapor deposition, a particle generation caused by a gas phase reaction may be suppressed because the first precursor and the second precursor are separately introduced.

In some embodiments, the first precursor may be titanium tetrachloride. The second precursor may be ammonia. Adsorbed titanium tetrachloride may form a titanium nitride monolayer. The ammonia in the second precursor introducing step may react with the titanium nitride monolayer and turn the titanium nitride monolayer into the layer of barrier material 505.

In some embodiments, the formation of the layer of barrier material 505 using atomic layer deposition may be performed with the assistance of plasma. The source of the plasma may be, for example, argon, hydrogen, oxygen, or a combination thereof. In some embodiments, the oxygen source may be, for example, water, oxygen gas, or ozone. In some embodiments, co-reactants may be introduced to the reaction chamber. The co-reactants may be selected from the group consisting of hydrogen, hydrogen plasma, oxygen, air, water, ammonia, hydrazines, alkylhydrazines, boranes, silanes, ozone, and a combination thereof.

In some embodiments, the formation of the layer of barrier material 505 may be performed using the following process conditions. The substrate temperature may be between about 160° C. and about 300° C. The evaporator temperature may be about 175° C. The pressure of the reaction chamber may be about 5 mbar. The solvent for the first precursor and the second precursor may be toluene.

Figure 7:
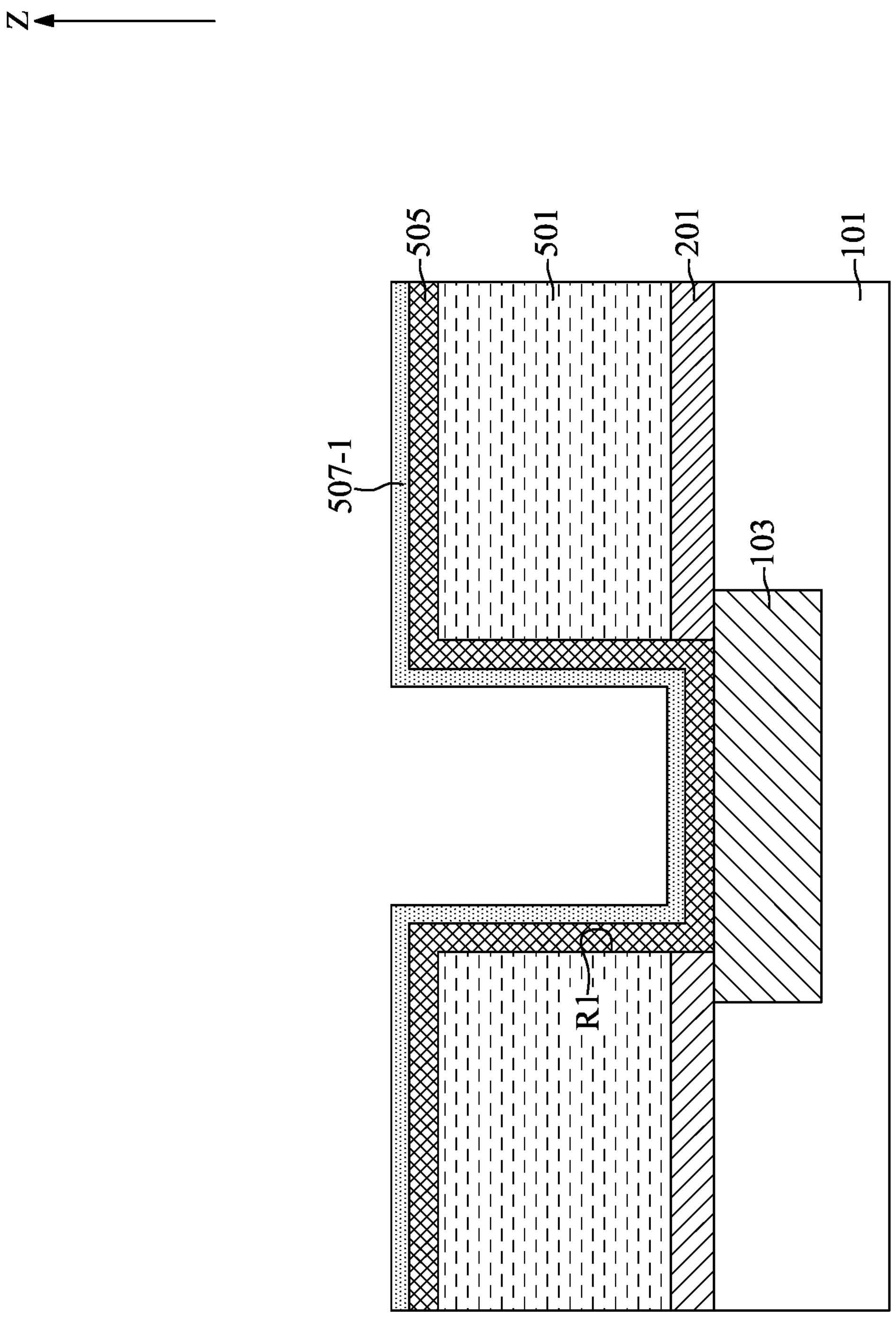
Figure 8:
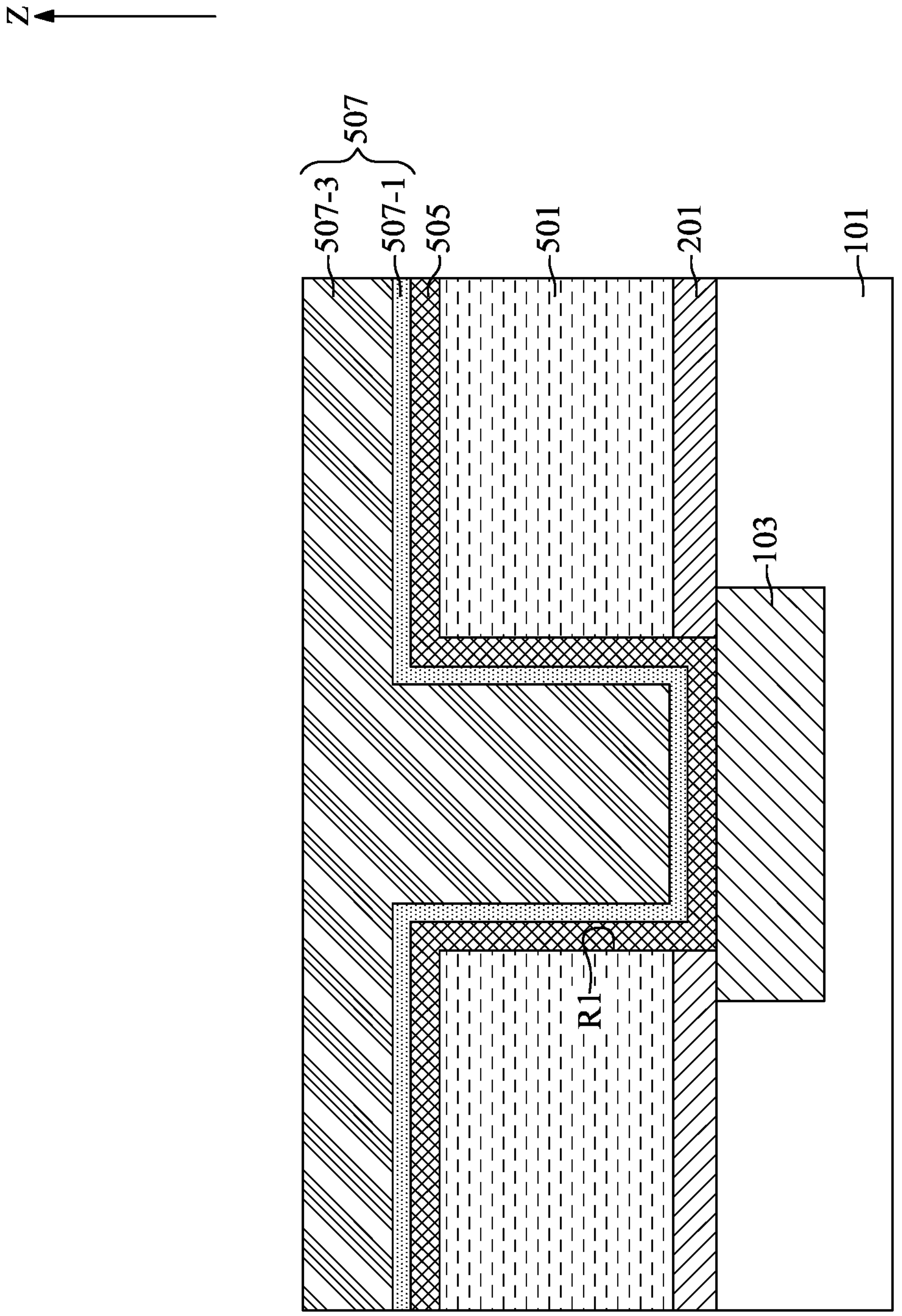

With reference to FIGS. 7 and 8, a nucleation portion 507-1 may be conformally formed on the layer of barrier material 505 and a bulk portion 507-3 may be formed on the nucleation portion 507-1, wherein the nucleation portion 507-1 and the bulk portion 507-3 together configure a layer of conductive material 507.

In some embodiments, the conductive material 507 may include tungsten. Tungsten may be particularly useful in gate electrodes and word and bit lines in dynamic random access memory types of integrated circuit devices because of its thermal stability during subsequent high temperature processes, where processing temperatures may reach 900° C. or more. Additionally, tungsten is a highly refractive material which offers good oxidation resistance and lower resistivity.

In some embodiments, the nucleation portion 507-1 may be a thin conformal layer that serves to facilitate the subsequent formation of a bulk material (i.e., the bulk portion 507-3) thereon. Conforming to the layer of barrier material 505 may be critical to support high quality deposition. In some embodiments, the nucleation portion 507-1 may be formed by a pulsed nucleation layer method.

In the pulsed nucleation layer method, pulses of reactant (e.g., reducing agent or precursor) may be sequentially injected and purged from the reaction chamber, typically by a pulse of a purge gas between reactants. A first reactant may be adsorbed onto the substrate (e.g., the layer of barrier material 505), available to react with the next reactant. The process is repeated in a cyclical fashion until the desired thickness is achieved. It should be noted that the pulsed nucleation layer method may be generally distinguished from atomic layer deposition by its higher operating pressure range (greater than 1 Torr) and its higher growth rate per cycle (greater than 1 monolayer film growth per cycle). The chamber pressure during the pulsed nucleation layer method may range from about 1 Torr to about 400 Torr.

In some embodiments, the reactants of forming the nucleation portion 507-1 may be, for example, a silicon-containing reducing agent and a tungsten-containing precursor. The layer of barrier material 505 may be initially exposed to the silicon-containing reducing agent and followed by exposure to the tungsten-containing precursor to form the nucleation portion 507-1. The exposure to the silicon-containing reducing agent and the tungsten-containing precursor may be defined as a cycle and may be repeated until the desired thickness of the nucleation portion 507-1 is achieved.

Silane and related compounds have been found to adsorb well to metal nitride surfaces such as titanium nitride and tungsten nitride used as barrier layer materials in some integrated circuit applications. Any suitable silane or silane derivative may be used as the silicon-containing reducing agent, including organic derivatives of silanes. It is generally understood that silanes adsorb on the substrate surface in a self-limiting manner to create nominally a monolayer of silane species. Thus, the amount of adsorbed species is largely independent of the silane dosage.

In some embodiments, the substrate temperature during the exposure to the silicon-containing reducing agent may be between about 200° C. and about 475° C., between about 300° C. and about 400° C., or about 300° C. In some embodiments, the chamber pressure during exposure to the silicon-containing reducing agent may be between about 1 Torr and about 350 Torr or be fixed around 40 Torr. The exposure time (or pulse time) may vary depending in part upon dosages and chamber conditions. In some embodiments, the layer of barrier material 505 is exposed until the surface is sufficiently and evenly covered with at least a saturated layer of silane species. In some embodiments, the silicon-containing reducing agent may be provided alone. In some embodiments, the silicon-containing reducing agent may be provided with a carrier gas such as argon or argon-hydrogen mixtures.

In some embodiments, once the layer of barrier material 505 is sufficiently covered with silane species, the flow of the silicon-containing reducing agent may be stopped. A purge process may be performed to clear residual gas reactants near the surface of the layer of barrier material 505. The purge process may be performed with a carrier gas such as argon, hydrogen, nitrogen, or helium.

In some embodiments, the tungsten-containing precursor may include tungsten hexafluoride, tungsten hexachloride, or tungsten hexacarbonyl. In some embodiments, the tungsten-containing precursor may include organo-metallic compounds that are free of fluorine, such as MDNOW (methylcyclopentadienyl-dicarbonylnitrosyl-tungsten) and EDNOW (ethylcyclopentadienyl-dicarbonylnitrosyl-tungsten). In some embodiments, the tungsten-containing precursor may be provided in a dilution gas, accompanying gases such as argon, nitrogen, hydrogen, or a combination thereof.

In some embodiments, the substrate temperature during exposure to the tungsten-containing precursor may be between about 200° C. and about 475° C., between about 300° C. and about 400° C., or about 300° C. In some embodiments, the chamber pressure during exposure to the tungsten-containing precursor may be between about 1 Torr and about 350 Torr. Tungsten-containing precursor dosage and substrate exposure time (or pulse time) will vary depending upon many factors. In general, the exposure may be performed until the adsorbed silane species is sufficiently consumed by reaction with the tungsten-containing precursor to produce the nucleation portion 507-1. Thereafter, the flow of tungsten-containing precursor may be stopped, and a purge process may be performed with a carrier gas such as argon, hydrogen, nitrogen, or helium.

Alternatively, in some embodiments, the reactants of forming the nucleation portion 507-1 may be, for example, a boron-containing reducing agent and the tungsten-containing precursor. The layer of barrier material 505 may be initially exposed to the boron-containing reducing agent and followed by exposure to the tungsten-containing precursor to form the nucleation portion 507-1. The exposure to the boron-containing reducing agent and the tungsten-containing precursor may be defined as a cycle and may be repeated until the desired thickness of the nucleation portion 507-1 is achieved.

In some embodiments, the boron-containing reducing agent may be, for example, borane, diborane, triborane, or boron halides (e.g., $BF_3$, $BCl_3$) with hydrogen. The tungsten-containing precursor may be material similar to the tungsten-containing precursor mentioned above, and descriptions thereof are not repeated herein. In some embodiments, the boron-containing reducing agent may be provided in a dilution gas, accompanying gases such as argon, nitrogen, hydrogen, silane, or a combination thereof. For example, diborane may be provided from a diluted source (e.g., 5% diborane and 95% nitrogen). In some embodiments, the substrate temperature during exposure to the boron-containing reducing agent may be between about 200° C. and about 475° C., between about 300° C. and about 400° C., or about 300° C. In some embodiments, the chamber pressure during exposure to the boron-containing reducing agent may be between about 1 Torr and about 350 Torr. In some embodiments, once the boron-containing reducing agent is deposited to a sufficient thickness, the flow of boron-containing reducing agent may be stopped. A purge process may be performed with a carrier gas such as argon, hydrogen, nitrogen, or helium.

After exposure to the boron-containing reducing agent, the intermediate semiconductor device may be then exposed to the tungsten-containing precursor. The process is similar to that of exposure to the tungsten-containing precursor after exposing to the silicon-containing reducing agent, and descriptions thereof are not repeated herein.

In some embodiments, a pre-treatment may be performed to the layer of barrier material 505 before forming the nucleation portion 507-1 using exposure to the boron-containing reducing agent and the tungsten-containing precursor. The pre-treatment may include diborane.

In some embodiments, exemplary data reveals that the diborane-based nucleation portion 507-1 may produce tungsten with greater grain size in the initial stage of forming the nucleation portion 507-1. In contrast, the silane-based nucleation portion 507-1 may produce tungsten with smaller grain size in the initial stage of forming the nucleation portion 507-1. That is, the deposited bulk portion 507-3 form on the silane-based nucleation portion 507-1 may have less or no defects such as seam and void.

Alternatively, the nucleation portion 507-1 may be formed by being sequentially exposed to the silicon-containing reducing agent, the tungsten-containing precursor, the boron-containing reducing agent, and the tungsten-containing precursor. The four steps of exposure may be defined as a cycle. The entire four-step cycle may be repeated to form the nucleation portion 507-1 with the desired thickness. In a variation of the process, the first two steps of the cycle (sequential exposure to the silicon-containing reducing agent and the tungsten-containing precursor) may be repeated one or more times prior to contact with the boron-containing reducing agent. In another variation, the last two steps of the cycle (sequential exposure to the boron-containing reducing agent and the tungsten-containing precursor) may be repeated one or more times after the first two steps are completed.

Alternatively, in some embodiments, the reactants of forming the nucleation portion 507-1 may be, for example, a germanium-containing reducing agent and the tungsten-containing precursor. The layer of barrier material 505 may be initially exposed to the germanium-containing reducing agent and followed by exposure to the tungsten-containing precursor to form the nucleation portion 507-1. In some embodiments, the germanium-containing reducing agent may be a germane such as $Ge_nH_{n+4}$, $Ge_nH_{n+6}$, $Ge_nH_{n+8}$, and $Ge_nH_m$, where n is an integer from 1 to 10, and n is a different integer than m. Other germanium-containing compounds may also be used, for example, alkyl germanes, alkyl germanium, aminogermanes, carbogermanes, and halogermane. The tungsten-containing precursor may be material similar to the tungsten-containing precursor mentioned above, and descriptions thereof are not repeated herein.

An exemplary process for forming the nucleation portion 507-1 may be illustrated as follows.

Firstly, the intermediate semiconductor device illustrated in FIG. 6 may be exposed to pulses of the germanium-containing reducing agent in a hydrogen environment to form a layer of germanium on the layer of barrier material 505. In some embodiments, the hydrogen-to-germanium-containing reducing agent ratio may be about 10:1, about 50:1, about 70:1, or about 100:1. The presence of hydrogen may decrease the thickness deposited per cycle, as well as decrease the resistivity of the deposited bulk portion 507-3.

In some embodiments, pulses of one or more additional reducing agents, such as pulses of the boron-containing or silicon-containing reducing agent, may be used. The additional reducing agents may be pulsed sequentially or simultaneously with the germanium-containing reducing agent. In some embodiments, interval time pauses between pulses may be between about 0.5 seconds and about 5 seconds. In some embodiments, the pulses of germanium-containing reducing agent may be optional, only the pulses of the boron-containing or silicon-containing reducing agent may be used.

In some embodiments, the duration of pulse (or pulse time) may be between about 0.25 seconds and about 30 seconds, between about 0.25 seconds and about 5 seconds, or between about 0.5 seconds and about 3 seconds. The pulse may be sufficient to saturate or oversaturate the surface of the layer of barrier material 505. In some embodiments, a carrier gas may be used, such as argon, helium, or nitrogen. In some embodiments, an optional purge process may be performed to purge excess germanium-containing reducing agent still in gas phase that did not adsorb to the surface of the layer of barrier material 505. The purge process may be conducted by flowing an inert gas at a fixed pressure thereby reducing the pressure of the chamber and re-pressurizing the chamber before initiating another gas exposure.

Next, the intermediate semiconductor device may be exposed to pulses of the tungsten-containing precursor. The tungsten-containing precursor reacts with the deposited layer of germanium to form elemental tungsten. In some embodiments, the duration of pulse (or pulse time) may be between about 0.25 seconds and about 30 seconds, between about 0.25 seconds to about 5 seconds, or between about 0.5 seconds to about 3 seconds. The pulse may be sufficient to react with the reactive sites on the surface of the layer of barrier material 505 where germanium adsorbs onto the surface. In some embodiments, the interval time pauses between pulses may be between about 0.5 seconds and about 5 seconds.

In some embodiments, a carrier gas may be used, such as argon, helium, or nitrogen. In some embodiments, exposure to the tungsten-containing precursor may be performed in a hydrogen environment. In some embodiments, an optional purge process may be performed to purge excess tungsten-containing precursor still in the gas phase that did not react to the germanium adsorbed onto the surface of the layer of barrier material 505. The purge process may be conducted by flowing an inert gas at a fixed pressure thereby reducing the pressure of the chamber and re-pressurizing the chamber before initiating another gas exposure.

Finally, exposure to the pulses of the germanium-containing reducing agent and the tungsten-containing precursor may be repeated until a desired thickness of the nucleation portion 507-1 is deposited on the surface of the layer of barrier material 505. Each repetition of exposure to the pulses of the germanium-containing reducing agent and the tungsten-containing precursor may be referred to as a cycle.

In some embodiments, the order of exposure to the pulses of the germanium-containing reducing agent and the tungsten-containing precursor may be reversed, such that the tungsten-containing precursor is pulsed first.

With reference to FIG. 8, the bulk portion 507-3 may be formed on the nucleation portion 507-1 and completely fill the first recess R1. The bulk portion 507-3 may be formed by, for example, physical vapor deposition, atomic layer deposition, molecular layer deposition, chemical vapor deposition, in-situ radical assisted deposition, metalorganic chemical vapor deposition, molecular beam epitaxy, sputtering, plating, evaporation, ion beam deposition, electron beam deposition, laser assisted deposition, chemical solution deposition, or a combination thereof.

For example, the deposition of the bulk portion 507-3 using chemical vapor deposition may include flowing (or introducing) a tungsten-containing precursor and a co-reactant such as a reducing agent to the intermediate semiconductor device including the nucleation portion 507-1. Example process pressure may be between about 10 Torr and about 500 Torr. Example substrate temperature may be between about 250° C. and about 495° C. The tungsten-containing precursor may be, for example, tungsten hexafluoride, tungsten chloride, or tungsten hexacarbonyl. The reducing agent may be, for example, hydrogen gas, silane, disilane, hydrazine, diborane, or germane.

In some embodiments, the grain size of tungsten of the bulk portion 507-3 may be greater than 30 nm, than 50 nm, than 70 nm, than 80 nm, than 85 nm, or than 87 nm. In some embodiments, the bulk portion 507-3 may include alpha phase tungsten.

A planarization process, such as chemical mechanical polishing, may be performed on the layer of conductive material 507 to provide a substantially flat surface for subsequent processing steps.

Figure 9:
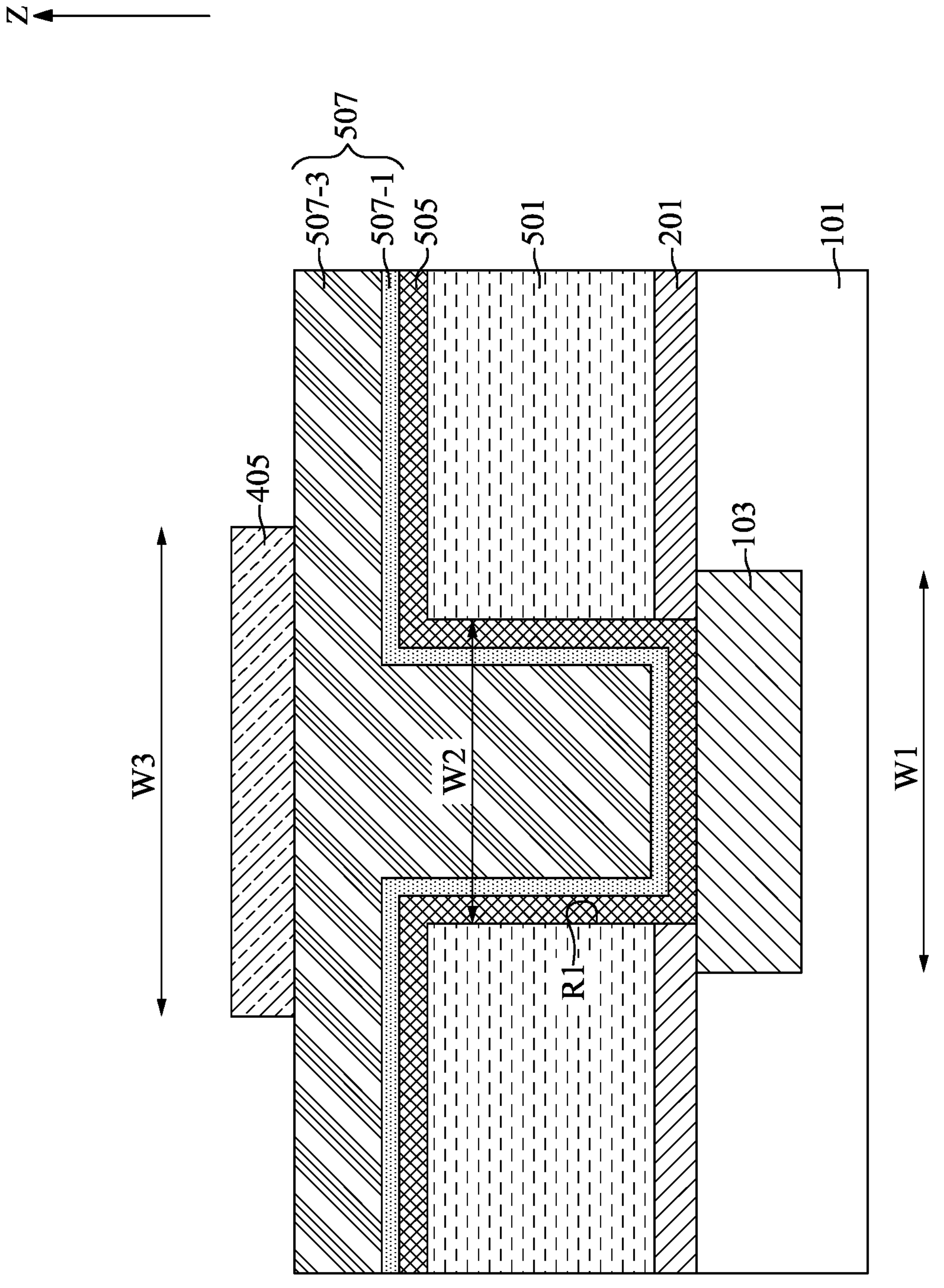

With reference to FIG. 9, a hard mask layer 405 may be formed on the layer of conductive material 507. In some embodiments, the width W3 of the hard mask layer 405 may be greater than the width W1 of the bottom interconnector layer 103. In some embodiments, the width W3 of the hard mask layer 405 and the width W1 of the bottom interconnector layer 103 may be substantially the same. In some embodiments, the width W3 of the hard mask layer 405 may be greater than the width W2 of the first recess R1.

In some embodiments, the hard mask layer 405 may be formed of, for example, a material having etching selectivity to the conductive material 507 or the barrier material 505. In some embodiments, the hard mask layer 405 may be formed of, for example, silicon, silicon germanium, tetraethyl orthosilicate, silicon nitride, silicon oxynitride, silicon nitride oxide, silicon carbide, the like, or a combination thereof. In some embodiments, the hard mask layer 405 may be formed by a deposition process such as chemical vapor deposition, plasma-enhanced chemical vapor deposition, atomic layer deposition, or the like. The process temperature of forming the hard mask layer 405 may be less than 400° C.

In some embodiments, the hard mask layer 405 may be formed of, for example, boron nitride, silicon boron nitride, phosphorus boron nitride, boron carbon silicon nitride, or the like. In some embodiments, the hard mask layer 405 may be formed by a film formation process and a treatment process. Detailedly, in the film formation process, first precursors, which may be boron-based precursors, may be introduced over the layer of conductive material 507 to form a boron-based layer. Subsequently, in the treatment process, second precursors, which may be nitrogen-based precursors, may be introduced to react with the boron-based layer and turn the boron-based layer into the hard mask layer 405.

In some embodiments, the first precursors may be, for example, diborane, borazine, or an alkyl-substituted derivative of borazine. In some embodiments, the first precursors may be introduced at a flow rate between about 5 sccm and about 50 slm (standard liter per minute) or between about 10 sccm and about 1 slm. In some embodiments, the first precursors may be introduced by dilution gas such as nitrogen, hydrogen, argon, or a combination thereof. The dilution gas may be introduced at a flow rate between about 5 sccm and about 50 slm or between about 1 slm and about 10 slm.

In some embodiments, the film formation process may be performed without an assistant of plasma. In such a situation, the substrate temperature of the film formation process may be between about 100° C. and about 1000° C. For example, the substrate temperature of the film formation process may be between about 300° C. and about 500° C. The process pressure of the film formation process may be between about 10 mTorr and about 760 Torr. For example, the process pressure of the film formation process may be between about 2 Torr and about 10 Torr.

In some embodiments, the film formation process may be performed in the presence of plasma. In such a situation, the substrate temperature of the film formation process may be between about 100° C. and about 1000° C. For example, the substrate temperature of the film formation process may be between about 300° C. and about 500° C. The process pressure of the film formation process may be between about 10 mTorr and about 760 Torr. For example, the process pressure of the film formation process may be between about 2 Torr and about 10 Torr. The plasma may be generated by a RF power between 2 W and 5000 W. For example, the RF power may be between 30 W and 1000 W.

In some embodiments, the second precursors may be, for example, ammonia or hydrazine. In some embodiments, the second precursors may be introduced at a flow rate between about 5 sccm and about 50 slm or between about 10 sccm and about 1 slm.

In some embodiments, oxygen-based precursors may be introduced with the second precursors in the treatment process. The oxygen-based precursors may be, for example, oxygen, nitric oxide, nitrous oxide, carbon dioxide, or water.

In some embodiments, silicon-based precursors may be introduced with the second precursors in the treatment process. The silicon-based precursors may be, for example, silane, trisilylamine, trimethylsilane, or silazanes (e.g., hexamethylcyclotrisilazane).

In some embodiments, phosphorus-based precursors may be introduced with the second precursors in the treatment process. The phosphorus-based precursors may be, for example, phosphine.

In some embodiments, oxygen-based precursors, silicon-based precursors, or phosphorus-based precursors may be introduced with the second precursors in the treatment process.

In some embodiments, the treatment process may be performed with an assistant of a plasma process, a UV cure process, a thermal anneal process, or a combination thereof.

When the treatment is performed with the assistance of the plasma process. The plasma of the plasma process may be generated by the RF power. In some embodiments, the RF power may be between about 2 W and about 5000 W at a single low frequency of between about 100 kHz up to about 1 MHz. In some embodiments, the RF power may be between about 30 W and about 1000 W at a single high frequency greater than about 13.6 MHz. In such a situation, a substrate temperature of the treatment process may be between about 20° C. and about 1000° C. The process pressure of the treatment process may be between about 10 mTorr and about 760 Torr.

When the treatment is performed with the assistance of the UV cure process, in such a situation, the substrate temperature of the treatment process may be between about 20° C. and about 1000° C. The process pressure of the treatment process may be between about 10 mTorr and about 760 Torr. The UV cure may be provided by any UV source, such as mercury microwave arc lamps, pulsed xenon flash lamps, or high-efficiency UV light emitting diode arrays. The UV source may have a wavelength of between about 170 nm and about 400 nm. The UV source may provide a photon energy between about 0.5 eV and about 10 eV, or between about 1 eV and about 6 eV. The assistance of the UV cure process may remove hydrogen from the hard mask layer 405. As hydrogen may diffuse through into other areas of the semiconductor device 1A and may degrade the reliability of the semiconductor device 1A, the removal of hydrogen by the assistance of UV cure process may improve the reliability of the semiconductor device 1A. In addition, the UV cure process may increase the density of the hard mask layer 405.

When the treatment is performed with the assistant of the thermal anneal process. In such a situation, a substrate temperature of the treatment process may be between about 20° C. and about 1000° C. The process pressure of the treatment process may be between about 10 mTorr and about 760 Torr.

Figure 10:
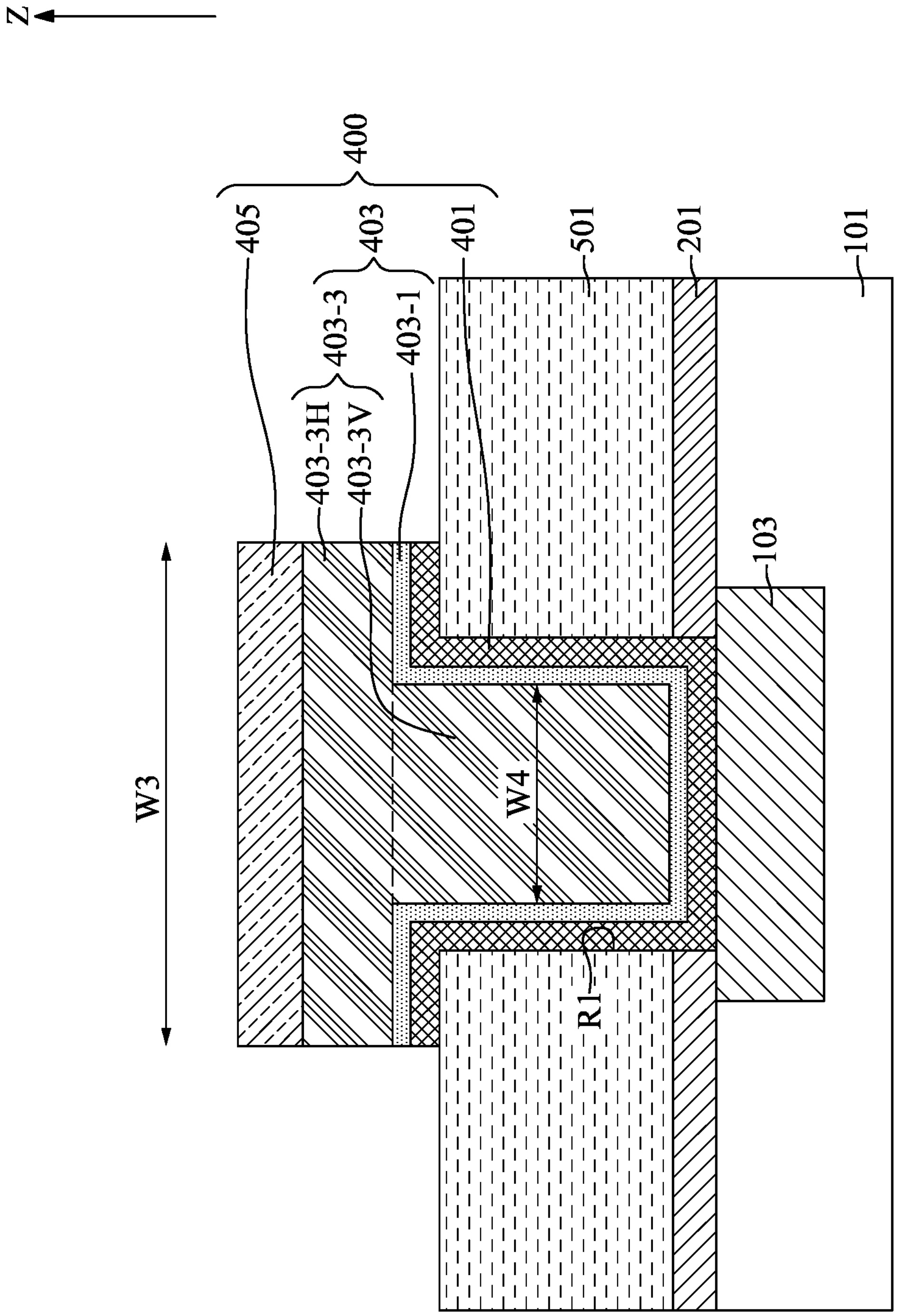

With reference to FIG. 10, a first etching process may be performed using the hard mask layer 405 as the mask to remove portions of the conductive material 507 and the barrier material 505. In some embodiments, the first etching process may be a multi-stage etching process. For example, the first etching process may be a two-stage anisotropic dry etching process. The etching chemistry may be different for each stage to provide different etching selectivity. In some embodiments, the etch rate ratio of the conductive material 507 to the hard mask layer 405 may be between about 100:1 and about 1.05:1, between about 15:1 and about 5:1, or between about 10:1 and about 3:1 during first stage of the first etching process. In some embodiments, the etch rate ratio of the conductive material 507 to the barrier material 505 may be between about 100:1 and about 1.05:1, between about 15:1 and about 5:1, or between about 10:1 and about 3:1 during first stage of the first etching process.

In some embodiments, the etch rate ratio of the barrier material 505 to the hard mask layer 405 may be between about 100:1 and about 1.05:1, between about 15:1 and about 5:1, or between about 10:1 and about 3:1 during second stage of the first etching process. In some embodiments, the etch rate ratio of the barrier material 505 to the bottom energy-removable layer 501 may be between about 100:1 and about 1.05:1, between about 15:1 and about 5:1, or between about 10:1 and about 3:1 during second stage of the first etching process.

With reference to FIG. 10, after the first etching process, the remaining conductive material 507 may be referred to as the conductive layer 403. The remaining barrier material 505 may be referred to as the barrier layer 401. The barrier layer 401, the conductive layer 403, and the hard mask layer 405 together configure the interconnector structure 400. The interconnector structure 400 may be formed on the bottom interconnector layer 103 and on the bottom energy-removable layer 501.

With reference to FIG. 10, the conductive layer 403 may include a nucleation portion 403-1 and a bulk portion 403-3. The nucleation portion 403-1 of the conductive layer 403 may be formed from the nucleation portion 507-1 of the layer of conductive material 507. The bulk portion 403-3 of the conductive layer 403 may be formed from the bulk portion 507-3 of the layer of conductive material 507.

With reference to FIG. 10, the bulk portion 403-3 may include a vertical segment 403-3V and a horizontal segment 403-3H. The vertical segment 403-3V may be disposed on the bottom interconnector layer 103 and in the first recess R1. The top part of the vertical segment 403-3V may protrude from the top surface 501TS of the bottom energy-removable layer 501. State differently, the top surface of the vertical segment 403-3V may be at a vertical level VL1 higher than the top surface 501TS of the bottom energy-removable layer 501. The bottom part of the vertical segment 403-3V may be surrounded by the bottom glue layer 201. In some embodiments, the width W4 of the vertical segment 403-3V may be less than the width W3 of the hard mask layer 405.

With reference to FIG. 10, the horizontal segment 403-3H may be disposed on the vertical segment 403-3V. In some embodiments, the horizontal segment 403-3H may have the same width W3 as the hard mask layer 405. In some embodiments, the width W3 of the horizontal segment 403-3H may be greater than the width W4 of the vertical segment 403-3V. That is, the bulk portion 403-3 may have a T-shaped cross-sectional profile.

With reference to FIG. 10, the barrier layer 401 may be conformally disposed between the conductive layer 403 and the bottom energy-removable layer 501, between the conductive layer 403 and the bottom glue layer 201, and between the conductive layer 403 and the bottom interconnector layer 103. Detailedly, the barrier layer 401 may be conformally disposed between the horizontal segment 403-3H and the bottom energy-removable layer 501, between the vertical segment 403-3V and the bottom energy-removable layer 501, between the vertical segment 403-3V and the bottom glue layer 201, and between the vertical segment 403-3V and the bottom interconnector layer 103. The barrier layer 401 may improve the adhesion between the conductive layer 403 and the bottom energy-removable layer 501, the bottom glue layer 201, and the bottom interconnector layer 103. The barrier layer 401 may also prevent the metal ion diffusing from the conductive layer 403 to the bottom energy-removable layer 501 or the substrate 101.

With reference to FIG. 10, the nucleation portion 403-1 may be conformally disposed between the barrier layer 401 and the bulk portion 403-3.

With reference to FIG. 1 and FIGS. 11 to 13, at step S15, a top glue layer 203 may be conformally formed on the bottom energy-removable layer 501 and on the interconnector structure 400, and a top energy-removable layer 503 may be formed surrounding the top glue layer 203.

Figure 11:
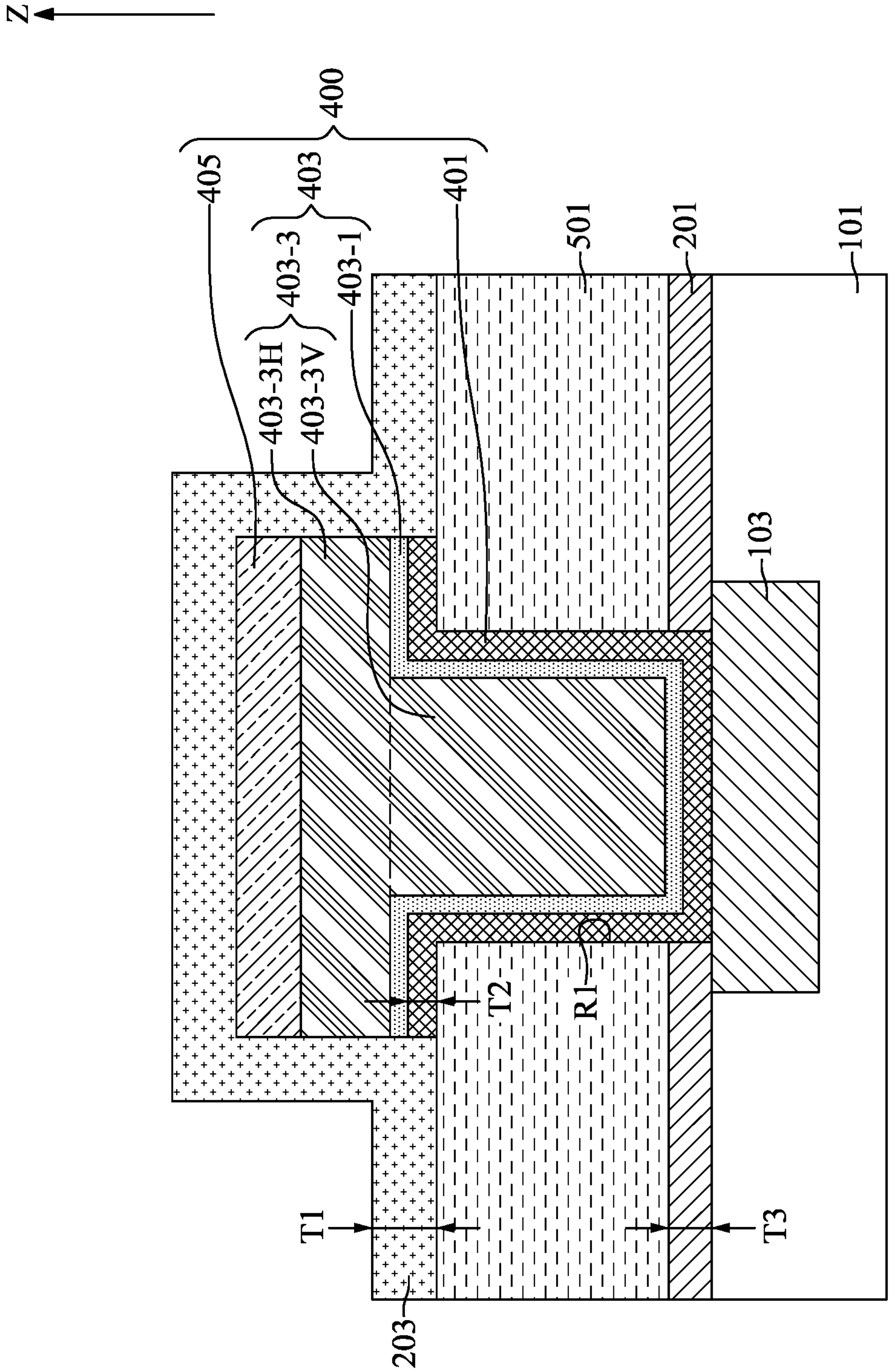

With reference to FIG. 11, the top glue layer 203 may be conformally formed on the bottom energy-removable layer 501 and covering the interconnector structure 400. In some embodiments, the thickness T1 of the top glue layer 203 may be greater than the thickness T2 of the barrier layer 401. In some embodiments, the thickness T1 of the top glue layer 203 and the thickness T2 of the barrier layer 401 may be substantially the same. In some embodiments, the thickness T1 of the top glue layer 203 may be greater than the thickness T3 of the bottom glue layer 201. In some embodiments, the thickness T1 of the top glue layer 203 may be less than the thickness T3 of the bottom glue layer 201. In some embodiments, the thickness T1 of the top glue layer 203 and the thickness T3 of the bottom glue layer 201 may be substantially the same.

In some embodiments, the top glue layer 203 may be formed of a low porous dielectric material. For example, the porosity of the top glue layer 203 may be less than 5%, less than 4%, less than 3%, less than 2%, less than 1%, or may be 0%. In some embodiments, the top glue layer 203 may be formed of, for example, silicon oxide. In some embodiments, the top glue layer 203 may be formed of a material having etching selectivity to the bottom energy-removable layer 501. In some embodiments, the top glue layer 203 may be formed of a material having etching selectivity to aluminum, copper, or tungsten. In some embodiments, the top glue layer 203 may be formed of, for example, silicon nitride, silicon oxynitride, silicon nitride oxide, or a combination thereof. In some embodiments, the top glue layer 203 may be formed by, for example, atomic layer deposition, chemical vapor deposition, plasma-enhanced chemical vapor deposition, or other applicable deposition processes. In some embodiments, the top glue layer 203 and the bottom glue layer 201 may be formed of the same material but is not limited thereto. In some embodiments, the top glue layer 203 may improve the adhesion between the bottom energy-removable layer 501 and a top energy-removable layer 503 which will be illustrated later. In some embodiments, the top glue layer 203 may also improve the adhesion between the interconnector structure 400 and the top energy-removable layer 503.

Figure 12:
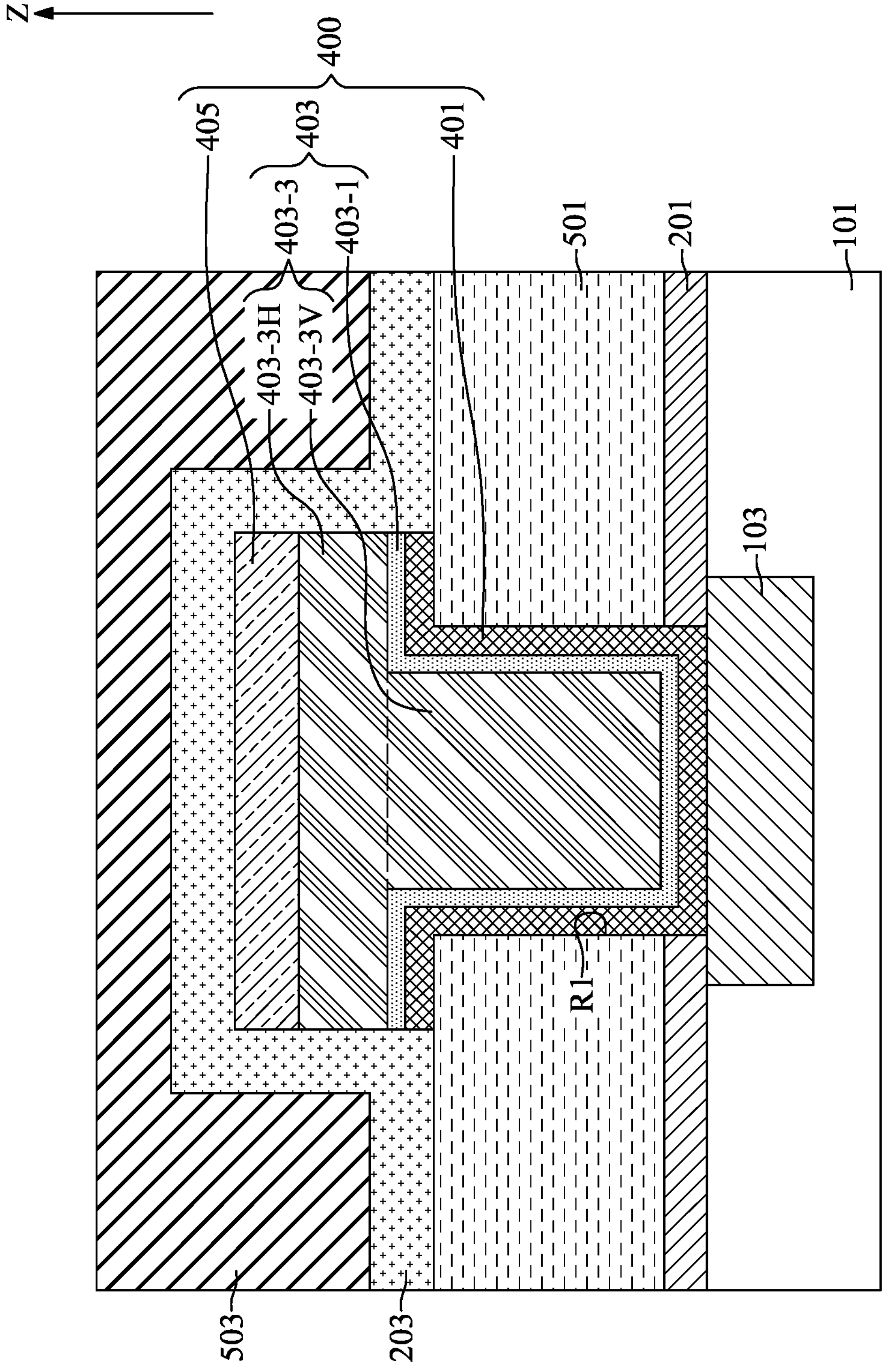

With reference to FIG. 12, a top energy-removable layer 503 may be formed on the top glue layer 203. In some embodiments, the top energy-removable layer 503 may include a material such as a thermal decomposable material, a photonic decomposable material, an e-beam decomposable material, or a combination thereof. For example, the top energy-removable layer 503 may include a base material and a decomposable porogen material that is sacrificially removed upon exposure to an energy source. The base material may include a methylsilsesquioxane based material. The decomposable porogen material may include a porogen organic compound that provides porosity to the base material of the top energy-removable layer 503.

In some embodiments, the ratio of the base material of the top energy-removable layer 503 may be less than the ratio of the base material of the bottom energy-removable layer 501. In some embodiments, the top energy-removable layer 503 may include about 55% of the decomposable porogen material, and about 45% of the base material. In some embodiments, the top energy-removable layer 503 may include about 65% of the decomposable porogen material, and about 35% of the base material. In some embodiments, the top energy-removable layer 503 may include about 75% of the decomposable porogen material, and about 25% of the base material. In some embodiments, the top energy-removable layer 503 may include about 85% of the decomposable porogen material, and about 15% of the base material.

Figure 13:
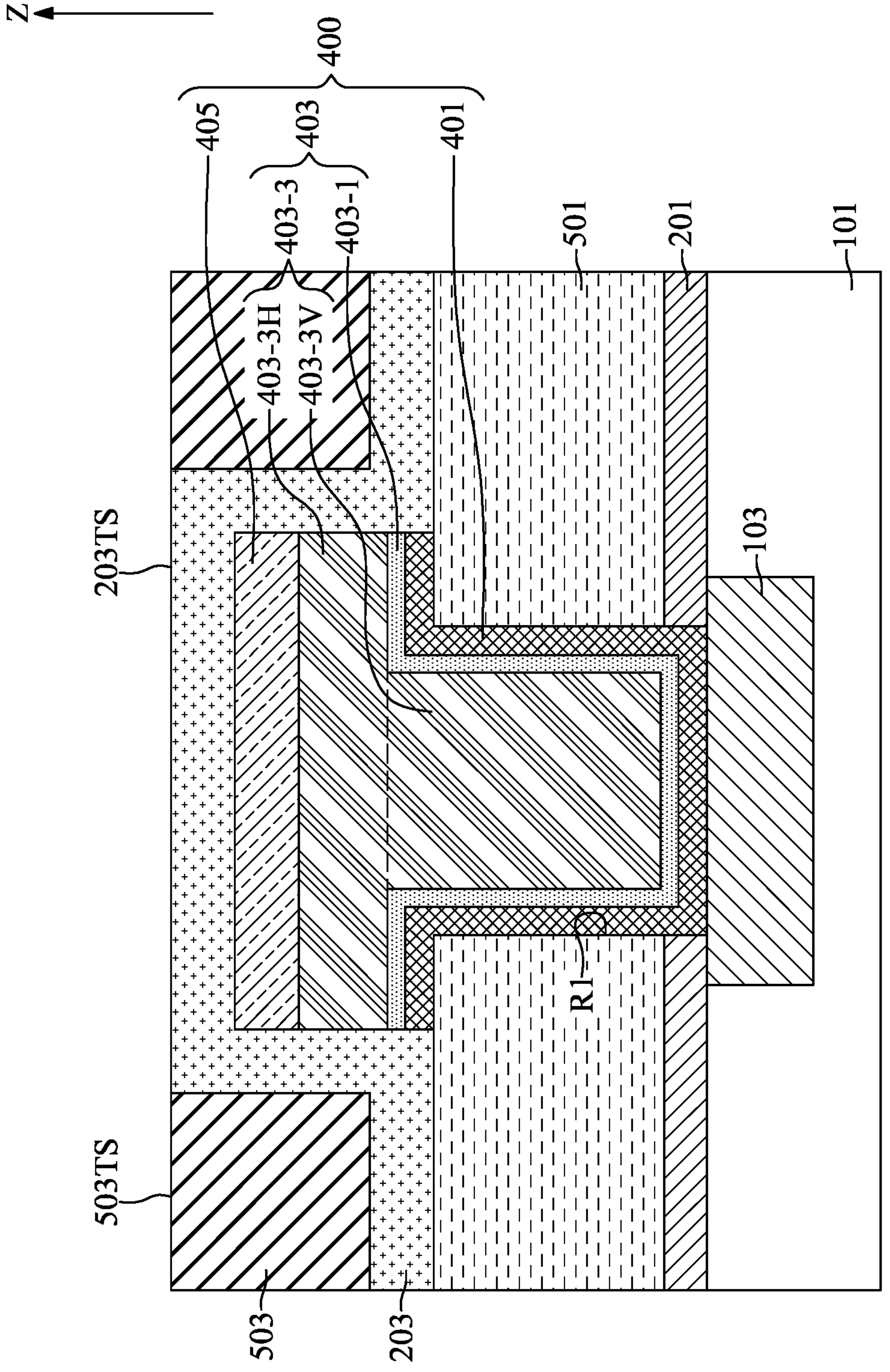

With reference to FIG. 13, a planarization process, such as chemical mechanical polishing, may be performed until the top surface 203TS of the top glue layer 203 is exposed to remove excess material and provide a substantially flat surface for subsequent processing steps. After the planarization process, the top surface 203TS of the top glue layer 203 and the top surface 503TS of the top energy-removable layer 503 may be substantially coplanar.

Figure 14:
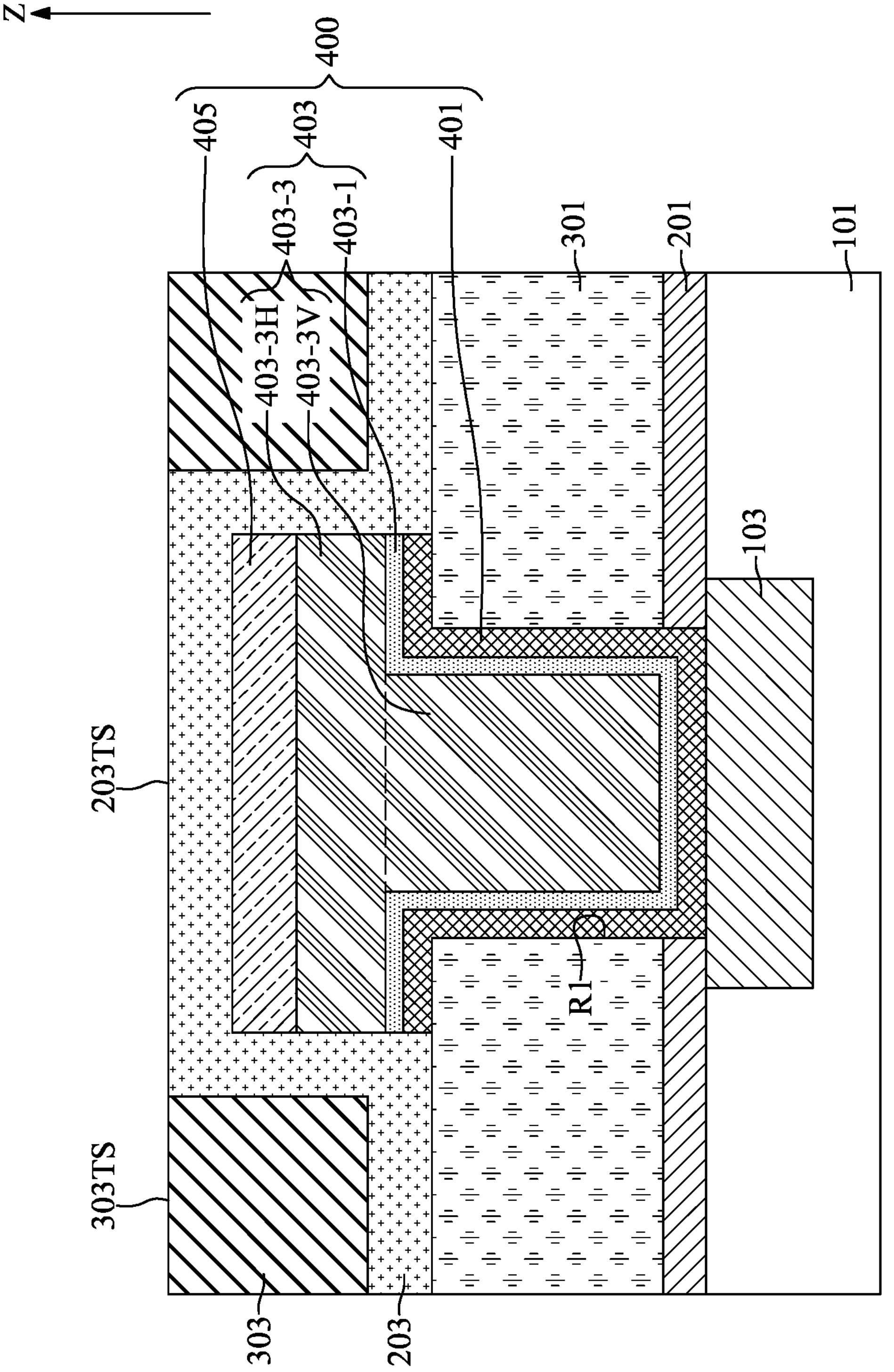
Figure 15:
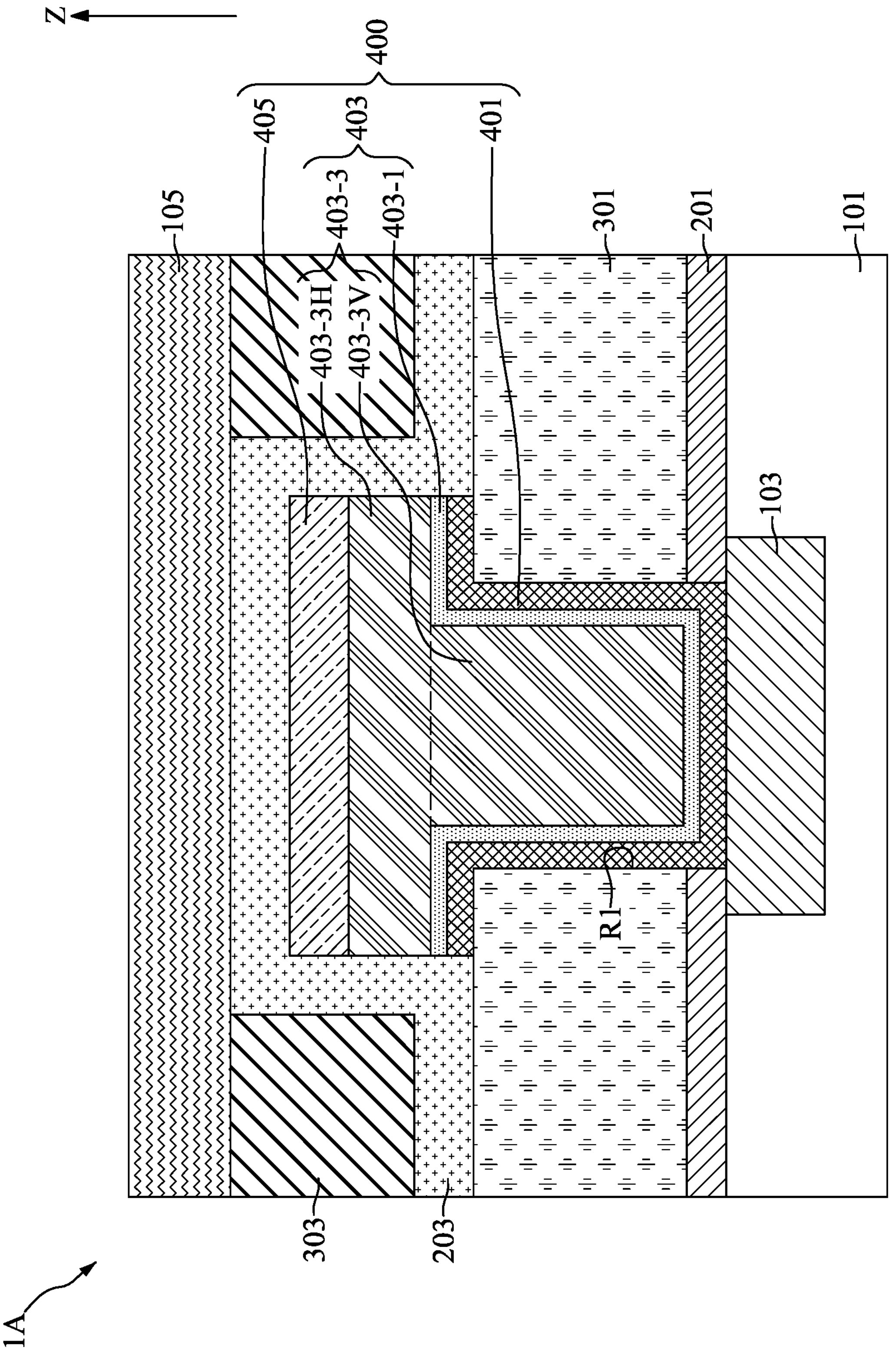

With reference to FIGS. 1, 14, and 15, at step S17, an energy treatment may be performed to turn the bottom energy-removable layer 501 into a bottom dielectric layer 301, turn the top energy-removable layer 503 into a top dielectric layer 303, and a capping dielectric layer 105 may be formed on the top dielectric layer 303 and the top glue layer 203.

With reference to FIG. 14, the energy treatment may be performed to the intermediate semiconductor device in FIG. 13 by applying the energy source thereto. The energy source may include heat, light, or a combination thereof. When heat is used as the energy source, the temperature of the energy treatment may be between about 800° C. and about 900° C. When light is used as an energy source, ultraviolet light may be applied. The energy treatment may remove the decomposable porogen material from the bottom energy-removable layer 501 and the top energy-removable layer 503 to generate empty spaces (pores), with the base material remaining in place. The empty spaces may be filled with air so that a dielectric constant of the resulting layers containing the empty spaces may be significantly low.

After the energy treatment, the bottom energy-removable layer 501 may be turned into the bottom dielectric layer 301. The top energy-removable layer 503 may be turned into the top dielectric layer 303. The top surface 303TS of the top dielectric layer 303 and the top surface 203TS of the top glue layer 203 may be substantially coplanar. In some embodiments, the bottom dielectric layer 301 and the top dielectric layer 303 may be both porous. In some embodiments, the porosity of the top dielectric layer 303 may be greater than the porosity of the bottom dielectric layer 301. In some embodiments, the porosity of the bottom dielectric layer 301 may be greater than the porosity of the bottom glue layer 201 or the top glue layer 203. In some embodiments, the porosity of the bottom dielectric layer 301 may be between about 20% and about 50%. In some embodiments, the porosity of the top dielectric layer 303 may be greater than 50%.

With reference to FIG. 15, the capping dielectric layer 105 may be formed on the top dielectric layer 303 and on the top glue layer 203. In some embodiments, the capping dielectric layer 105 may be formed of, for example, silicon dioxide, undoped silicate glass, fluorosilicate glass, borophosphosilicate glass, a spin-on low-k dielectric layer, a chemical vapor deposition low-k dielectric layer, or a combination thereof. The term "low-k" as used throughout the present application denotes a dielectric material that has a dielectric constant of less than silicon dioxide. In some embodiments, the capping dielectric layer 105 may include a self-planarizing material such as a spin-on glass or a spin-on low-k dielectric material such as SiLK™. The use of a self-planarizing dielectric material may avoid the need to perform a subsequent planarizing step. In some embodiments, the capping dielectric layer 105 may be formed by a deposition process including, for example, chemical vapor deposition, plasma enhanced chemical vapor deposition, evaporation, or spin-on coating.

By employing the bottom dielectric layer 301 and the top dielectric layer 303 having low dielectric constant, the parasitic capacitance of the semiconductor device 1A may be reduced. As a result, the performance of the semiconductor device 1A may be improved. In addition, the barrier layer 401 may prevent outgassing issues of the porous layers (i.e., the bottom dielectric layer 301 and the top dielectric layer 303) to avoid the damage of the interconnector structure 400 and to improve the reliability of the semiconductor device 1A. Furthermore, the bottom glue layer 201 and the top glue layer 203 may also improve the adhesion of the bottom dielectric layer 301 and the top dielectric layer 303.

Figure 16:
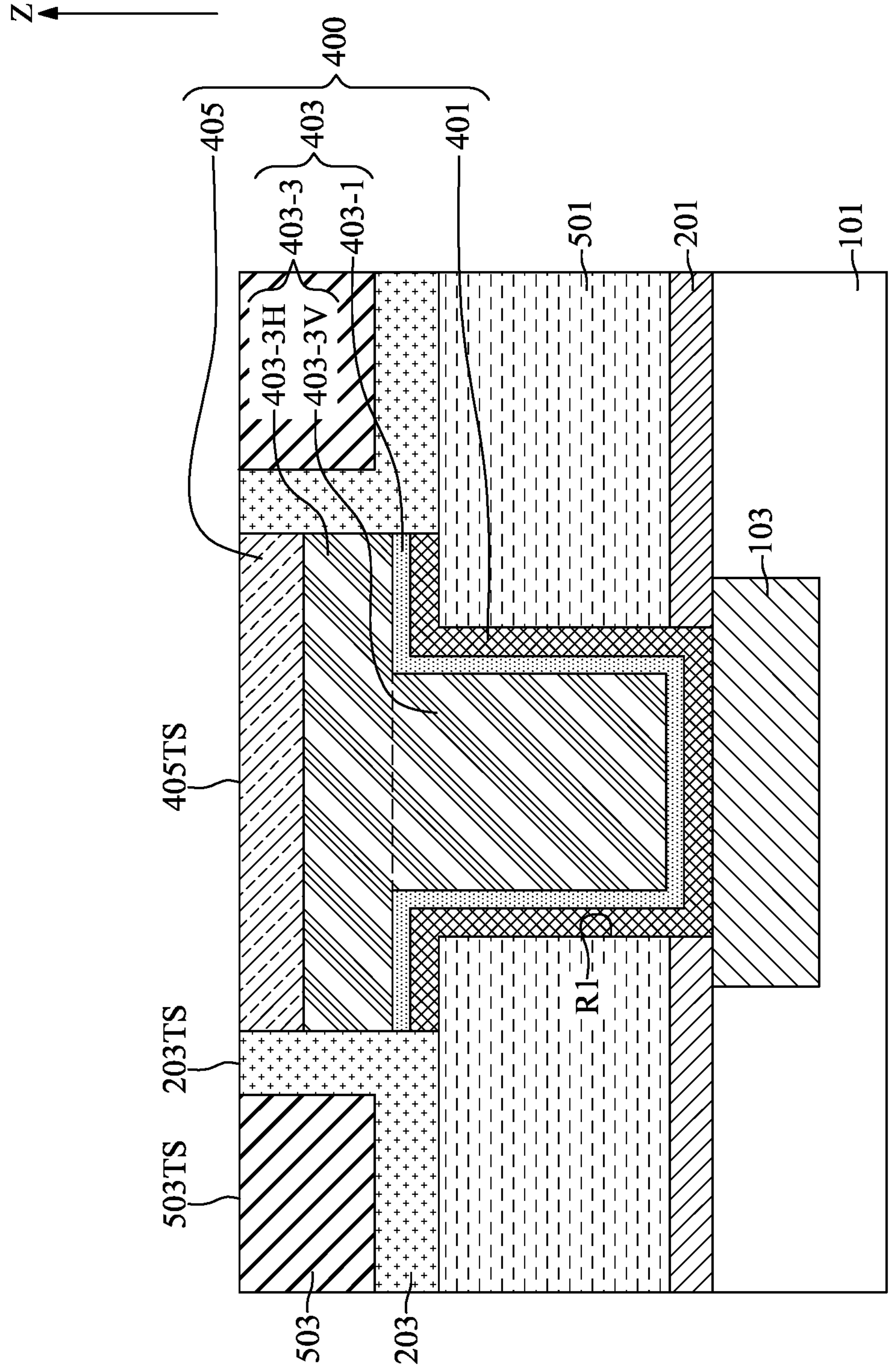
FIGS. 16 to 18 illustrate, in schematic cross-sectional view diagrams, a flow for fabricating a semiconductor device in accordance with another embodiment of the present disclosure.
Figure 17:
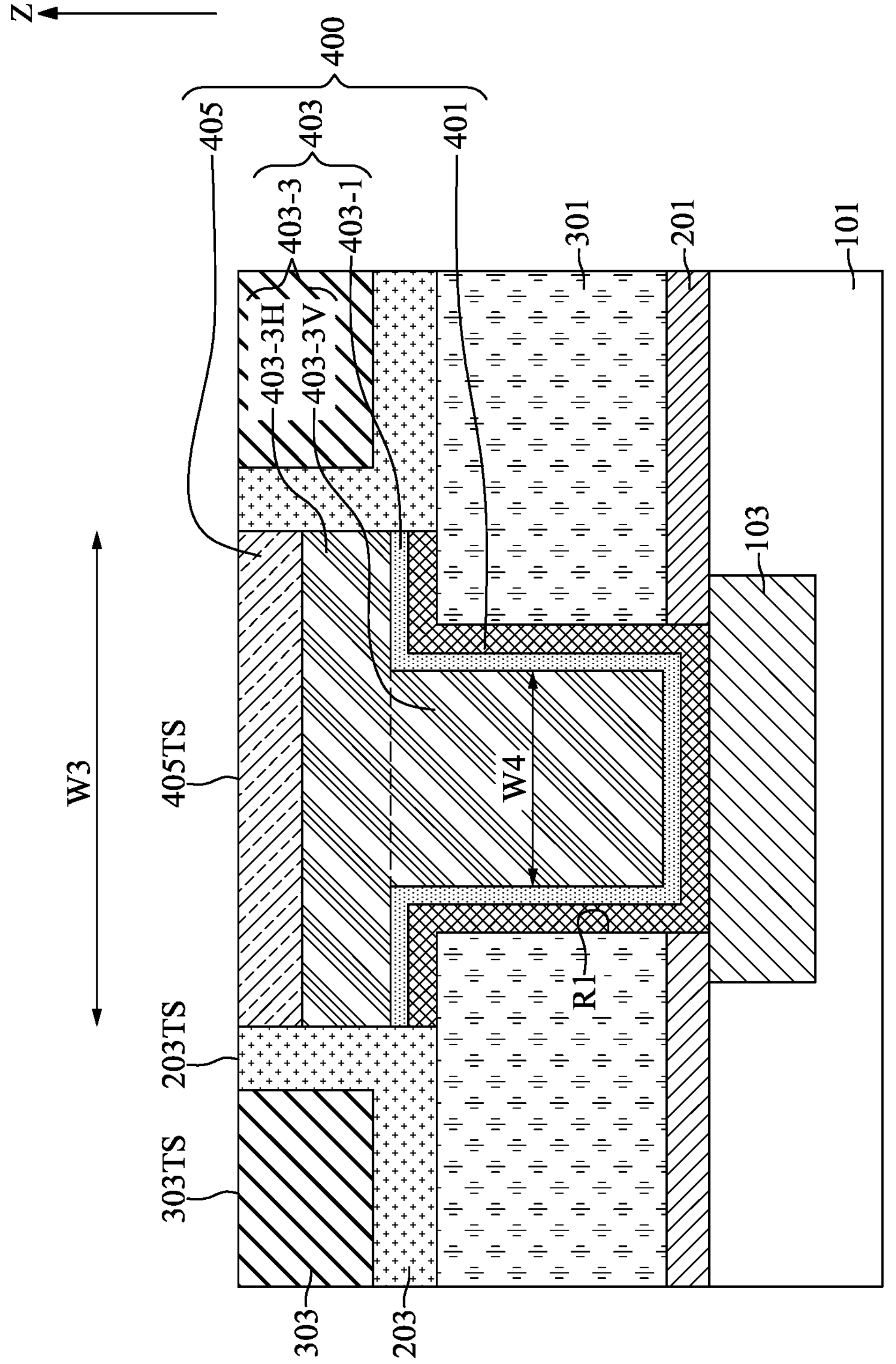
Figure 18:
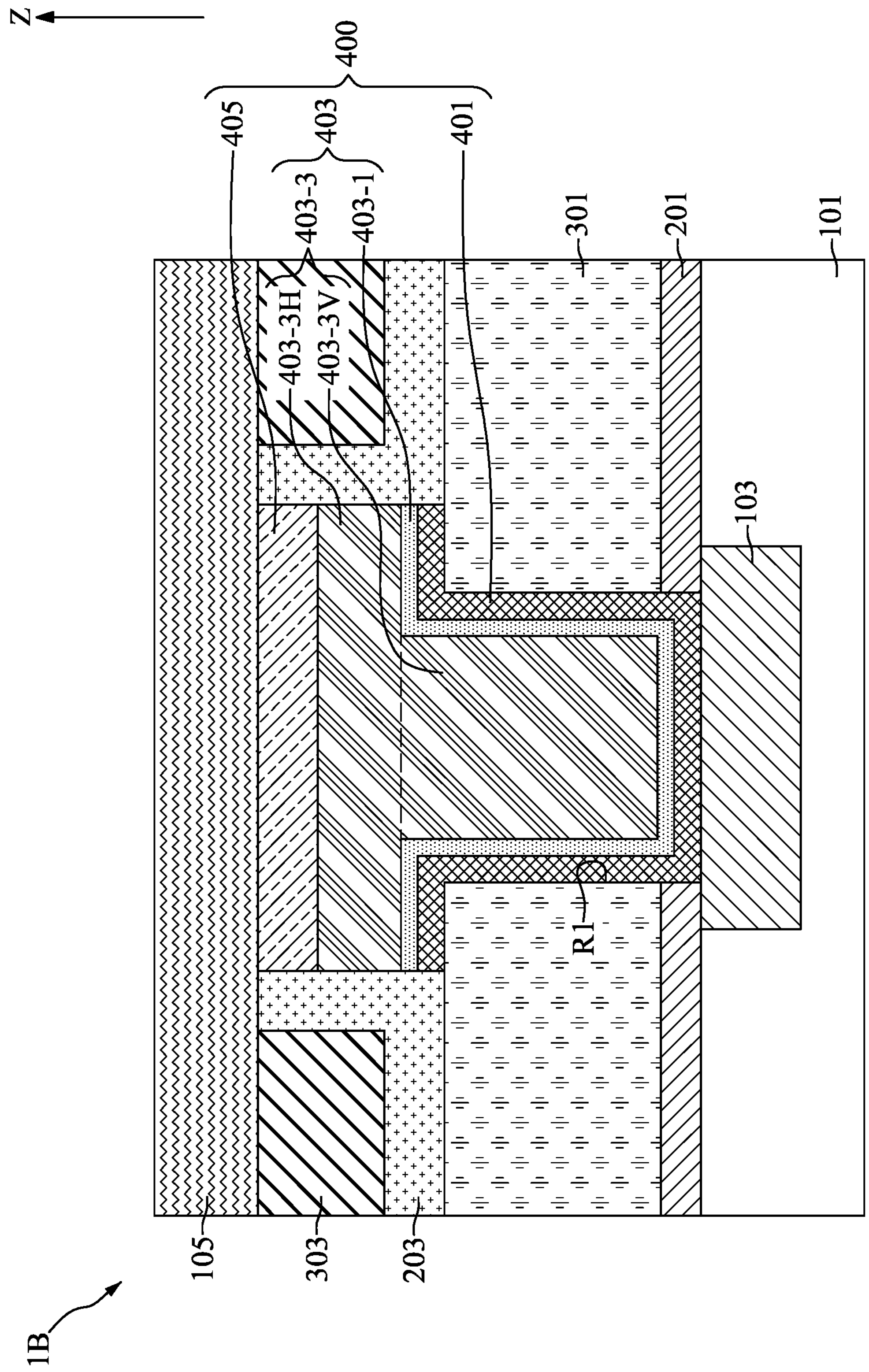

FIGS. 16 to 18 illustrate, in schematic cross-sectional view diagrams, a flow for fabricating a semiconductor device 1B in accordance with another embodiment of the present disclosure.

With reference to FIG. 16, an intermediate semiconductor device may be fabricated with a procedure similar to that illustrated in FIGS. 2 to 12, and descriptions thereof are not repeated herein. A planarization process, such as chemical mechanical polishing, may be performed until the top surface 405TS of the hard mask layer 405 is exposed to remove excess material and provide a substantially flat surface for subsequent processing steps. The top surface 405TS of the hard mask layer 405, the top surface 203TS of the top glue layer 203, and the top surface 503TS of the top energy-removable layer 503 may be substantially coplanar.

With reference to FIG. 17, the energy treatment may be performed with a procedure similar to that illustrated in FIG. 14, and descriptions thereof are not repeated herein. The top surface 405TS of the hard mask layer 405, the top surface 203TS of the top glue layer 203, and the top surface 303TS of the top dielectric layer 303 may be substantially coplanar.

With reference to FIG. 18, the capping dielectric layer 105 may be formed on the hard mask layer 405, on the top glue layer 203, and on the top dielectric layer 303 with a procedure similar to that illustrated in FIG. 15, and descriptions thereof are not repeated herein.

One aspect of the present disclosure provides a semiconductor device including a substrate; a bottom interconnector layer positioned in the substrate; a bottom dielectric layer positioned on the substrate; an interconnector structure positioned along the bottom dielectric layer, positioned on the bottom interconnector layer, and positioned on the bottom dielectric layer; a top glue layer conformally positioned on the bottom dielectric layer and the interconnector structure; a top dielectric layer positioned surrounding the top glue layer. A top surface of the top glue layer and a top surface of the top dielectric layer are substantially coplanar. The top dielectric layer is porous.

Another aspect of the present disclosure provides a semiconductor device including a substrate; a bottom interconnector layer positioned in the substrate; a bottom dielectric layer positioned on the substrate; an interconnector structure positioned along the bottom dielectric layer, positioned on the bottom interconnector layer, and positioned on the bottom dielectric layer; a top glue layer conformally positioned on the bottom dielectric layer and surrounding the interconnector structure; a top dielectric layer positioned surrounding the top glue layer. A top surface of the top glue layer and a top surface of the interconnector structure are substantially coplanar. The top dielectric layer is porous.

Another aspect of the present disclosure provides a method for fabricating a semiconductor device including providing a substrate; forming a bottom interconnector layer in the substrate; forming a bottom energy-removable layer on the substrate; forming an interconnector structure along the bottom energy-removable layer and on the bottom energy-removable layer and the bottom interconnector layer; conformally forming a top glue layer on the bottom dielectric layer and the interconnector structure; forming a top energy-removable layer surrounding the top glue layer; performing an energy treatment to turn the bottom energy-removable layer into a bottom dielectric layer and turn the top energy-removable layer into a top dielectric layer. A top surface of the top glue layer and a top surface of the top dielectric layer are substantially coplanar. The top dielectric layer and the bottom dielectric layer are porous.

Due to the design of the semiconductor device of the present disclosure, the parasitic capacitance of the semiconductor device 1A may be reduced by employing the bottom dielectric layer 301 and the top dielectric layer 303 having low dielectric constant. As a result, the performance of the semiconductor device 1A may be improved. In addition, the barrier layer 401 may prevent outgassing issues of the porous layers (i.e., the bottom dielectric layer 301 and the top dielectric layer 303) to avoid the damage of the interconnector structure 400 and to improve the reliability of the semiconductor device 1A. Furthermore, the bottom glue layer 201 and the top glue layer 203 may also improve the adhesion of the bottom dielectric layer 301 and the top dielectric layer 303.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:

a substrate;

a bottom dielectric layer positioned on the substrate;

an interconnector structure and positioned on the bottom dielectric layer;

a top glue layer conformally positioned on the bottom dielectric layer and surrounding the interconnector structure;

a top dielectric layer positioned surrounding the top glue layer;

a bottom glue layer positioned between the substrate and the bottom dielectric layer, wherein the bottom glue layer and the top glue layer comprise the same material, wherein a thickness of the top glue layer is greater than a thickness of the bottom glue layer; and a bottom interconnector layer positioned in the substrate at a position that a top surface of the bottom interconnector layer is coplanar with a top surface of the substrate;

wherein a top surface of the top dielectric layer, a top surface of the top glue layer and a top surface of the interconnector structure are substantially coplanar;

wherein the top dielectric layer is porous;

wherein the bottom dielectric layer is porous;

wherein the porosity of the bottom dielectric layer is greater than a porosity of the top glue layer, wherein the top glue layer has a vertical portion in contact with a side surface of the interconnector structure and horizontal portion in contact with a top surface of the bottom dielectric layer, wherein the top surface of the top glue layer at the vertical portion is coplanar with the top surface of the top dielectric layer;

wherein the interconnector structure is positioned on the top surface of the bottom interconnector layer, wherein the top surface of the bottom interconnector layer is partially covered by the bottom glue layer;

wherein the interconnector structure comprises a conductive layer comprising:

a vertical segment positioned along the bottom dielectric layer and the bottom glue layer, and positioned on the bottom interconnector layer; and a horizontal segment positioned on the vertical segment and on the bottom dielectric layer.

2. The semiconductor device of claim 1, wherein a width of the horizontal segment is greater than a width of the vertical segment.

3. The semiconductor device of claim 2, further comprising a hard mask layer positioned on the horizontal segment;

wherein the top surface of the top glue layer and a top surface of the hard mask layer are substantially coplanar.

4. The semiconductor device of claim 3, wherein a width of the hard mask layer and the width of the horizontal segment are substantially the same.

5. The semiconductor device of claim 4, further comprising a barrier layer has a first portion positioned between the horizontal segment of the conductive layer and the bottom dielectric layer, a second portion between the vertical segment of the conductive layer and the bottom dielectric layer and between the conductive layer and the bottom glue layer, and a third portion between the conductive layer and the bottom interconnector layer, wherein the first portion of the barrier layer is in contact with the top glue layer.

* * * * *